United States Patent [19]
Hewes

[11] 4,336,613
[45] Jun. 22, 1982

[54] CHARGE COUPLED DEVICE FILTERS AND MODEMS INCORPORATING SUCH FILTERS

[75] Inventor: Charles R. Hewes, Dallas, Tex.

[73] Assignee: Texas Instruments Incorporated, Dallas, Tex.

[21] Appl. No.: 811,657

[22] Filed: Jun. 30, 1977

[51] Int. Cl.³ .............................................. H04L 27/10
[52] U.S. Cl. ......................................... 375/9; 375/80; 375/82; 455/266; 333/18; 333/193
[58] Field of Search ............ 325/30, 59, 61, 320–321, 325/322, 326; 340/207 D, 209, 147 C, 171 A, 147 SY; 307/221 D; 333/18, 165, 166, 167, 193; 179/15 A, 15 AD; 455/266, 59, 61; 375/79, 80, 82, 88, 89, 91, 76, 14, 9

[56] References Cited

U.S. PATENT DOCUMENTS

| | | | |
|---|---|---|---|
| 3,832,637 | 8/1974 | Alexander et al. | 375/9 |
| 3,879,664 | 4/1975 | Monsen | 325/321 |
| 3,902,165 | 8/1975 | Artom | 333/18 |
| 3,909,527 | 9/1975 | Ohta et al. | 325/30 |
| 3,942,034 | 3/1976 | Buss | 333/165 |
| 3,943,448 | 3/1976 | Motley et al. | 325/321 |
| 3,978,407 | 8/1976 | Forney, Jr. | 333/18 |
| 3,999,152 | 12/1976 | Sato et al. | 333/70 T |
| 4,132,950 | 1/1979 | Cochran et al. | 455/266 |

*Primary Examiner*—Tommy P. Chin
*Attorney, Agent, or Firm*—Robert Groover, III; James T. Comfort; Melvin Sharp

[57] ABSTRACT

A Modem utilizing process technology compatible CCD and IGFET circuits and sub-systems incorporated on a single I.C. chip. CCD transversal filters are employed as bandpass filters, being tuned for different modes of operation by adjustment of the clock frequency. The bandpass filters are operated in conjunction with a charge amplifier to remove d.c. offset from the analog output of the filters. The demodulator section of the Modem also incorporates low-pass filter employing switched resistors. The modulator section includes waveform generators based on a digital-to-analog converter including switched capacitors having values selected such that a sine wave having minimal distortion is generated when switched in proper sequence. Provision is made for digital inputs to control the frequency and amplitude of the sine wave output. The Modem can be operated under control of a microprocessor.

22 Claims, 24 Drawing Figures

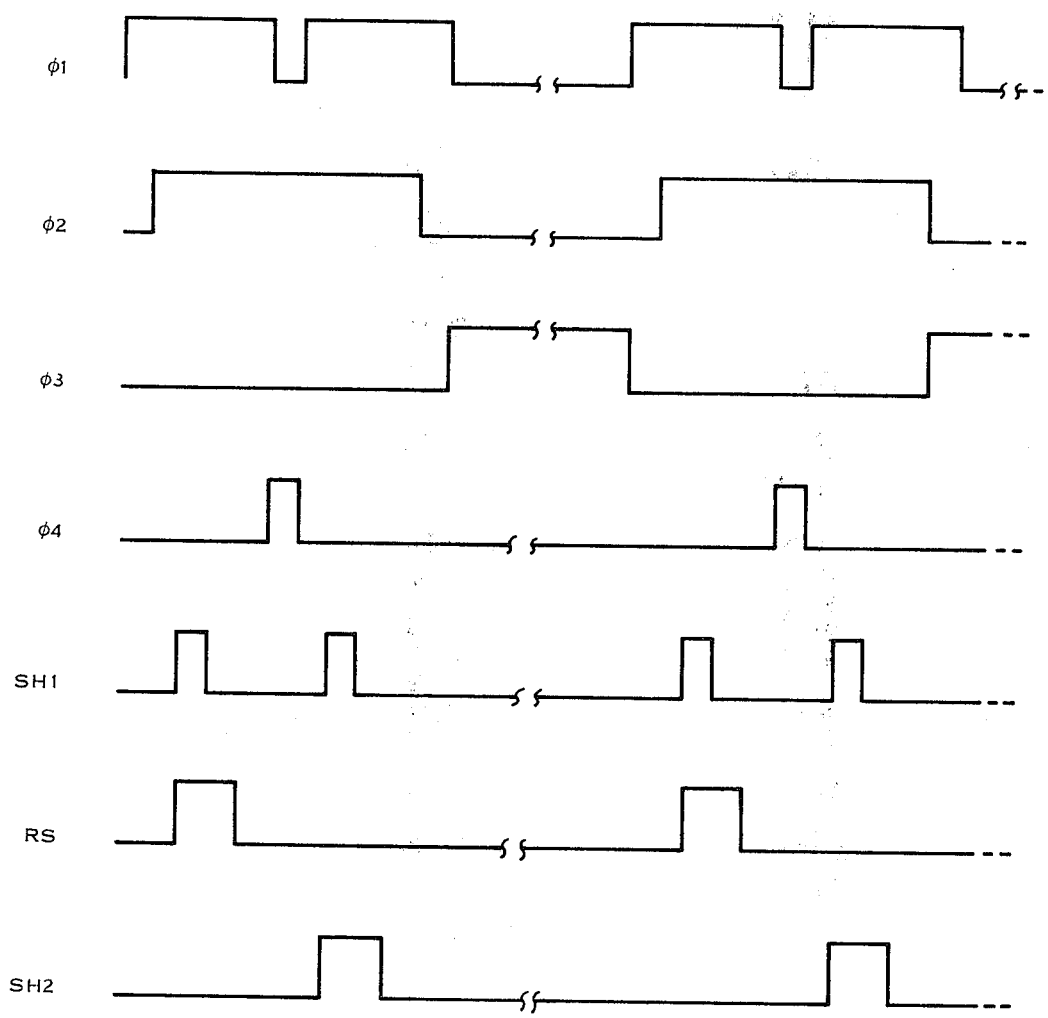

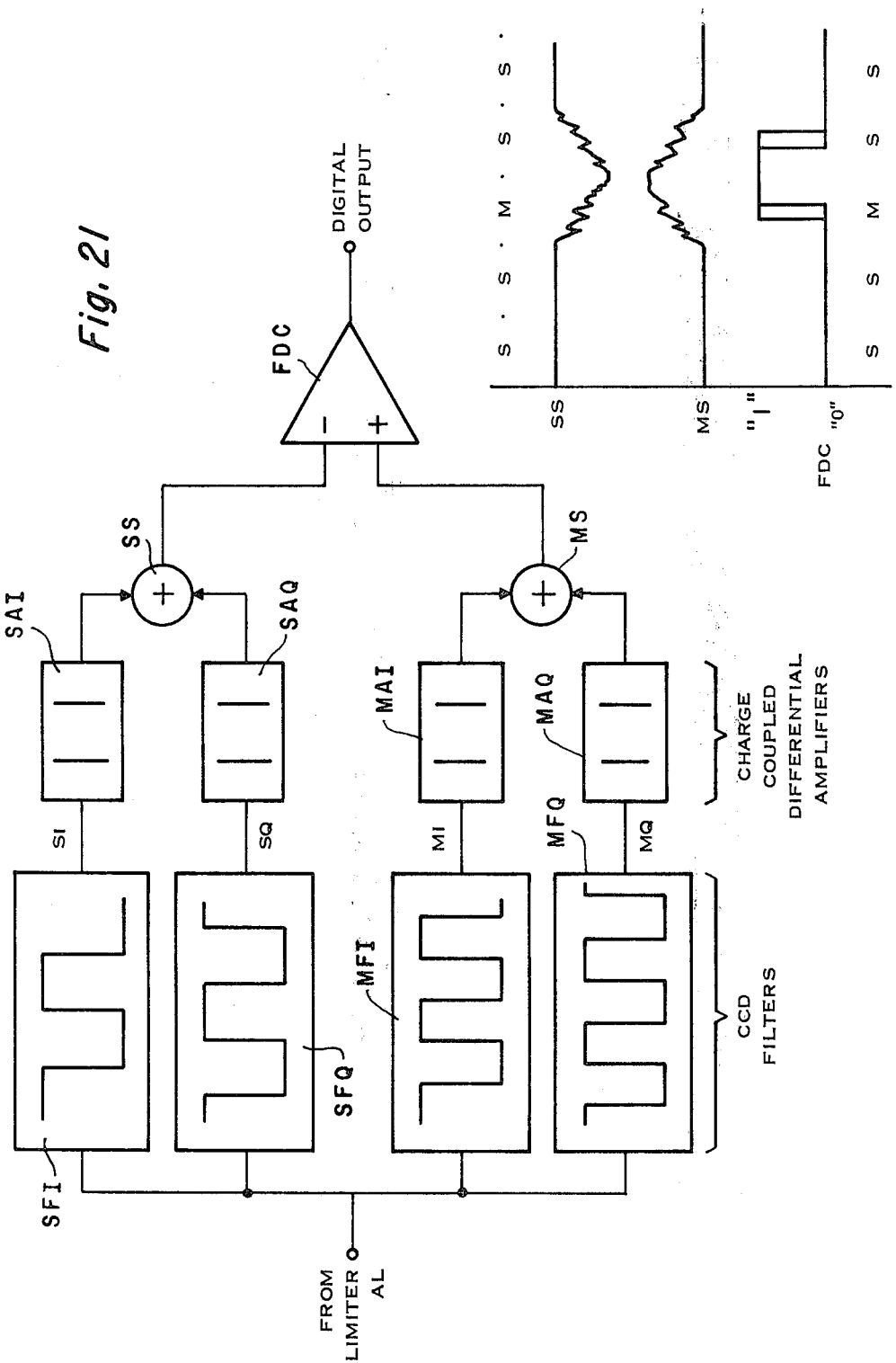

CHARGE COUPLED DEVICE FILTERS AND MODEMS INCORPORATING SUCH FILTERS

BACKGROUND OF THE INVENTION

This invention relates to signal processing systems and has particular reference to charge coupled device bandpass filter structures and manner of operation thereof as well as to demodulators and modems employing such bandpass filters.

Charge coupled device bandpass filters have previously been proposed, see for example U.S. Pat. No. 3,997,973 issued Dec. 21, 1976 and co-pending applications Ser. No. 758,365 filed Jan. 10, 1977 by Lawrence H. Ragan for "Programmable Frequency Converting Filter" and Ser. No. 758,366 filed Jan. 10, 1977 by Jerry L. Norris et al. for "Frequency Converting Filter", all assigned to the assignee of the present application.

Modems also are well known, being widely employed in data transmission systems for demodulation of incoming analog signals into digital mark/space data and for modulation of mark/space data in the outgoing analog signal. R. C. French in "Binary Transistor Filters in Data Modems", The Radio and Electronic Engineer, Vol. 44, No. 7, July 1974, pages 357 to 362 describes the use of binary transistor filters in modems, teaching the use of a transistor filter as a matched filter and suggesting in general terms that such filters might be implemented using charge coupled devices to implement an analog delay line.

It is an object of the present invention to provide an improved charge coupled device bandpass filter structure for filtering analog signals to provide an output signal with reduced offset voltage content.

It is also an object of the invention to provide a multi-channel bandpass filter apparatus including a plurality of charge coupled device bandpass filters all having the same structure but operable to define different passbands.

It is a further object of the invention to provide modem apparatus including charge coupled device bandpass filters.

In one aspect, the invention provides apparatus for receiving and filtering modulated analog signals having different carrier frequencies. Input terminal means is provided for receiving said analog signals on at least two frequency channels. There is an individual charge coupled device bandpass filter for each of said two channels and switching means operable to select and connect one of said bandpass filters between said input terminal means and frequency discriminator means. Each of said bandpass filter means has an identical structure and includes phase electrode sets, each said set including a split-electrode for signal amplitude weighting, the split electrodes of each filter disposed and configured to define a bandpass characteristic for said filter. Means are provided for applying phased pulses to said bandpass filter phase electrodes such that the frequencies of said phased pulses are different for each said filter and each filter has a predetermined center frequency and bandwidth. The switch lines are operated by switching pulses to select a particular bandpass filter having a center frequency matched with the carrier frequency of the analog signal received at said input terminal means.

In another aspect, the invention provides signal filtering apparatus comprising a two-phase charge coupled device bandpass filter having input means for receiving analog signal samples, the charge coupled device bandpass filter means having phase electrode sets each set including a split electrode for signal amplitude weighting, the disposition and configuration of split electrodes defining a bandpass filter characteristic for said filter. First portions of said split electrodes are connected in common to a first sampling gate; and the other portions of said split electrodes are connected in common to a second sampling gate. Clock pulses are applied to said electrode sets to shift charge between the electrode sets. First gating pulses are applied to said first and second sampling gates while analog signal charge is stored at charge storage sites beneath electrodes of said sets other than said split electrodes thereby to sample signals associated with stray capacitances coupled to said split electrodes to produce respective first and second offset voltages. Second gating pulses are applied to said first and second sampling gates while signal charge is stored beneath said split electrodes of said electrode sets thereby to sample the signal charge beneath said split electrodes to produce first and second signal related voltages each including an offset voltage, and means operable to subtract said first and second offset voltages from said first and second signal related voltages respectively to produce first and second signal voltages substantially free from offset voltage content.

The invention also provides modem apparatus including demodulator means for converting modulated analog signals received at a signal terminal means to digital mark/space signals, and modulator means for converting digital mark/space signals into modulated analog signals and transmitting said analog signals to said signal terminal means for transmission therefrom.

The demodulator has input circuit means including an individual charge coupled device bandpass filter for each of at least two data channels each selectively operable according to different transmission standards and switching means operable to select and connect one of said bandpass filters to said signal terminal means for demodulating said received analog signals. Each of said bandpass filter means has an identical structure and includes multi-phase electrode sets, each said set including a split-electrode for signal amplitude weighting, the split electrodes of each filter disposed and configured to define a bandpass characteristic for said filter. Means are provided for applying phased pulses to said bandpass filter phase electrodes such that the frequencies of said phased pulses are different for each said filter and each filter has a predetermined center frequency and bandwidth determined by the frequency of said phased signals. Switching pulses are applied to operate said switching means to select a particular bandpass filter and apply phased pulses thereto to provide a center frequency matched with the carrier frequency of an analog signal received on a particular channel at said signal terminal means.

The modulator means may comprise a plurality of capacitor means connected in series between a common output means and respective switching means to charge or discharge said capacitor means, and means for operating said switches in a selected sequence and at an adjustable rate for charging and discharging said capacitors to generate at said output means an output signal having a wave form determined by said selected sequence and a frequency determined by said adjustable rate.

In a particular embodiment, a modem is provided having full duplex capability at a 300 baud transmission rate, at both U.S.A. and C.C.I.T.T. standards, half duplex capability at a 1200 baud transmission rate, also at both U.S.A. and C.C.I.T.T. standards, together with additional low speed reverse channel modes, all such functions provided utilizing only three CCD bandpass filters selectively clocked at different rates to provide the required adjustments of bandpass characteristics. The modem structure together with the required clock generator and control circuits can be fabricated on a single semiconductor chip using, for example, current MOS process technology, which may be housed, for example, in a 24-pin plastic encapsulated package. There is thus provided a very compact integrated modem structure which may be economically produced and suited to control by a microprocessor to enable data transmission and reception in a variety of modes according to different transmission standards whether coupled directly or indirectly within acoustic coupling to a transmission line. There is thus provided a significant advance in the art compared with currently available solid state modems using individual, dedicated active element bandpass filters based on operational amplifiers.

By way of example, embodiments of the invention will be described in greater detail with reference to the drawings wherein.

Figure 1:
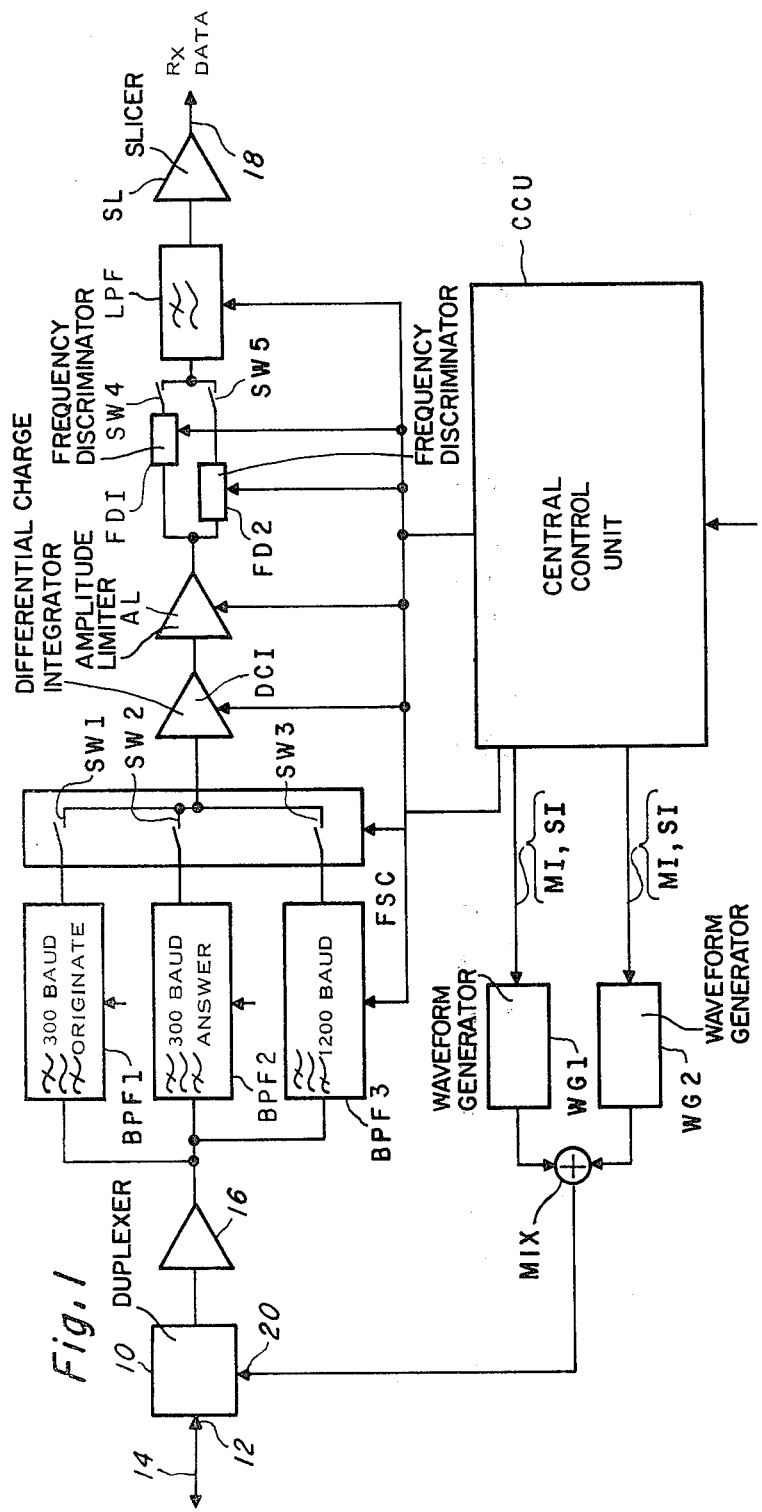
FIG. 1 shows the basic structure of a modem embodying the present invention.
Figure 3:
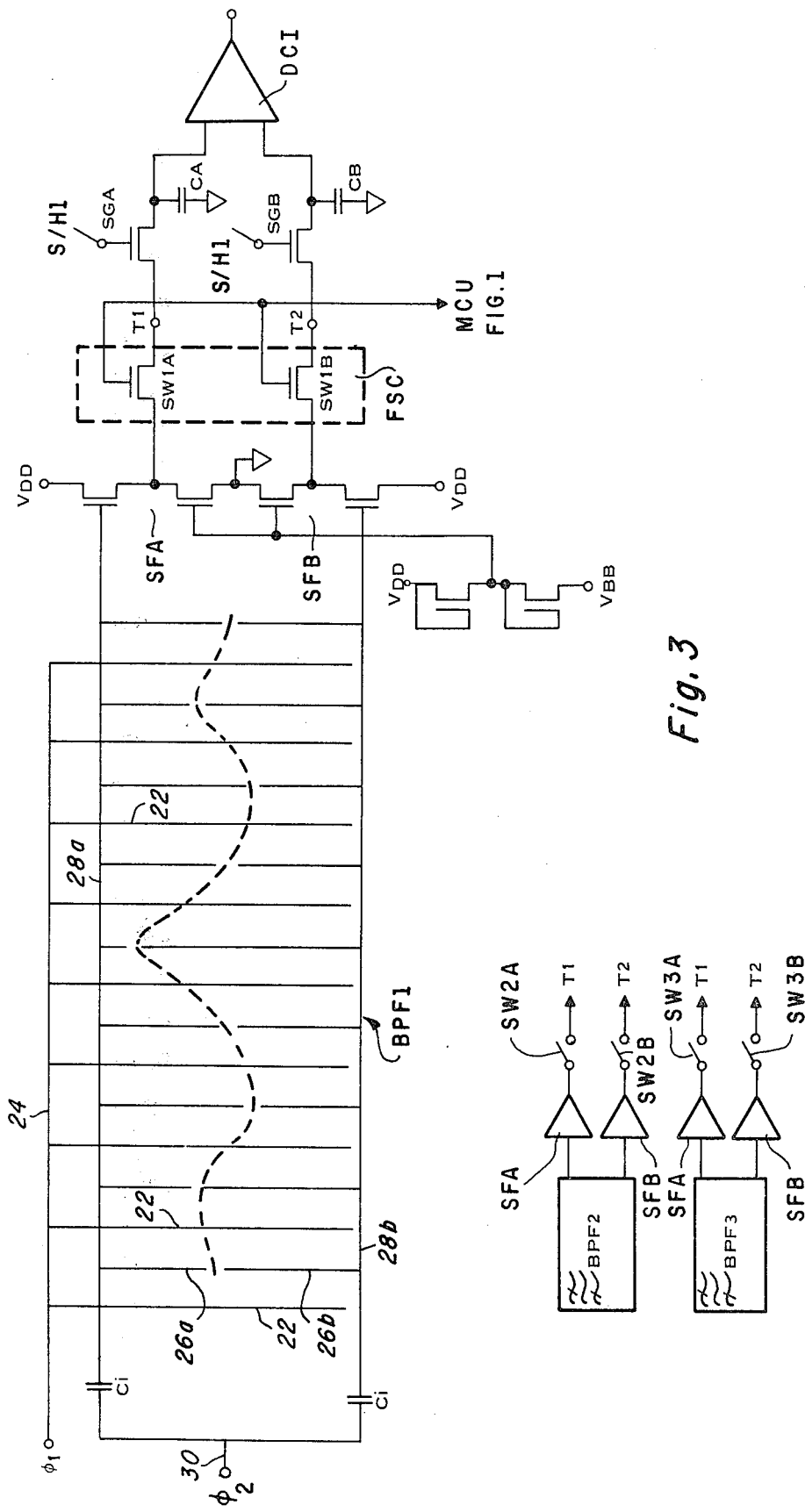
Figure 5A:
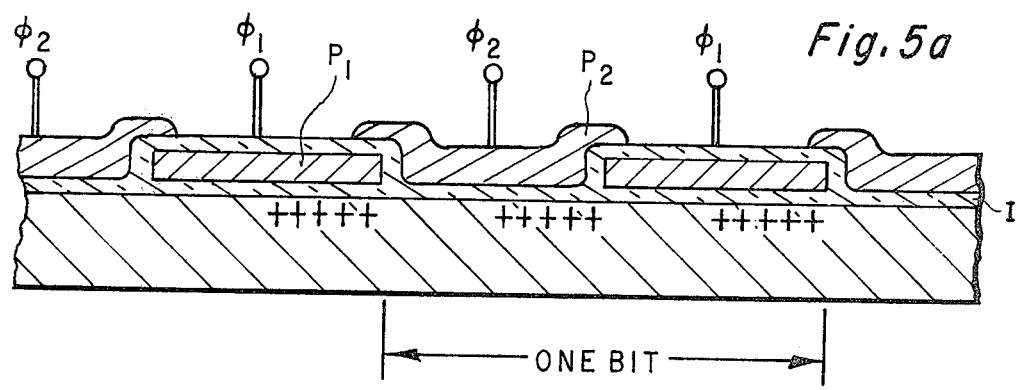
Figure 5B:
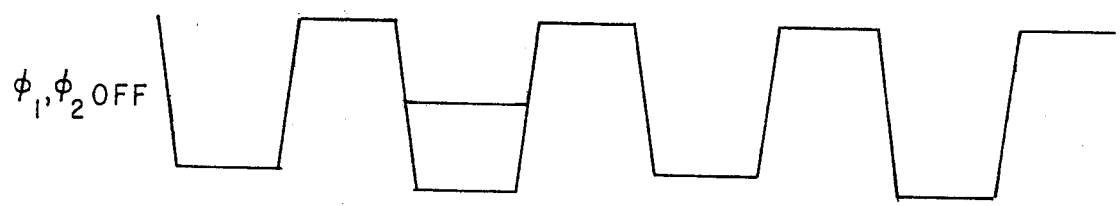
Figure 5C:
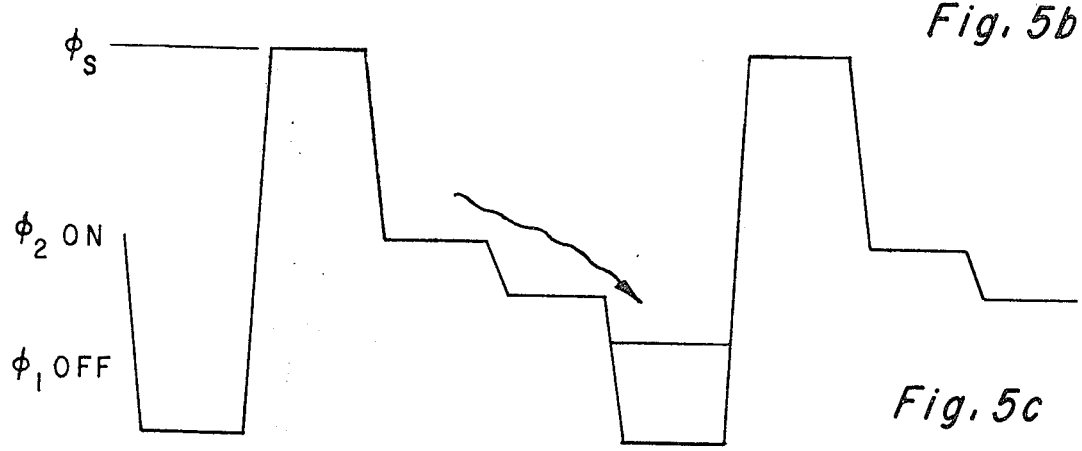
Figure 6:
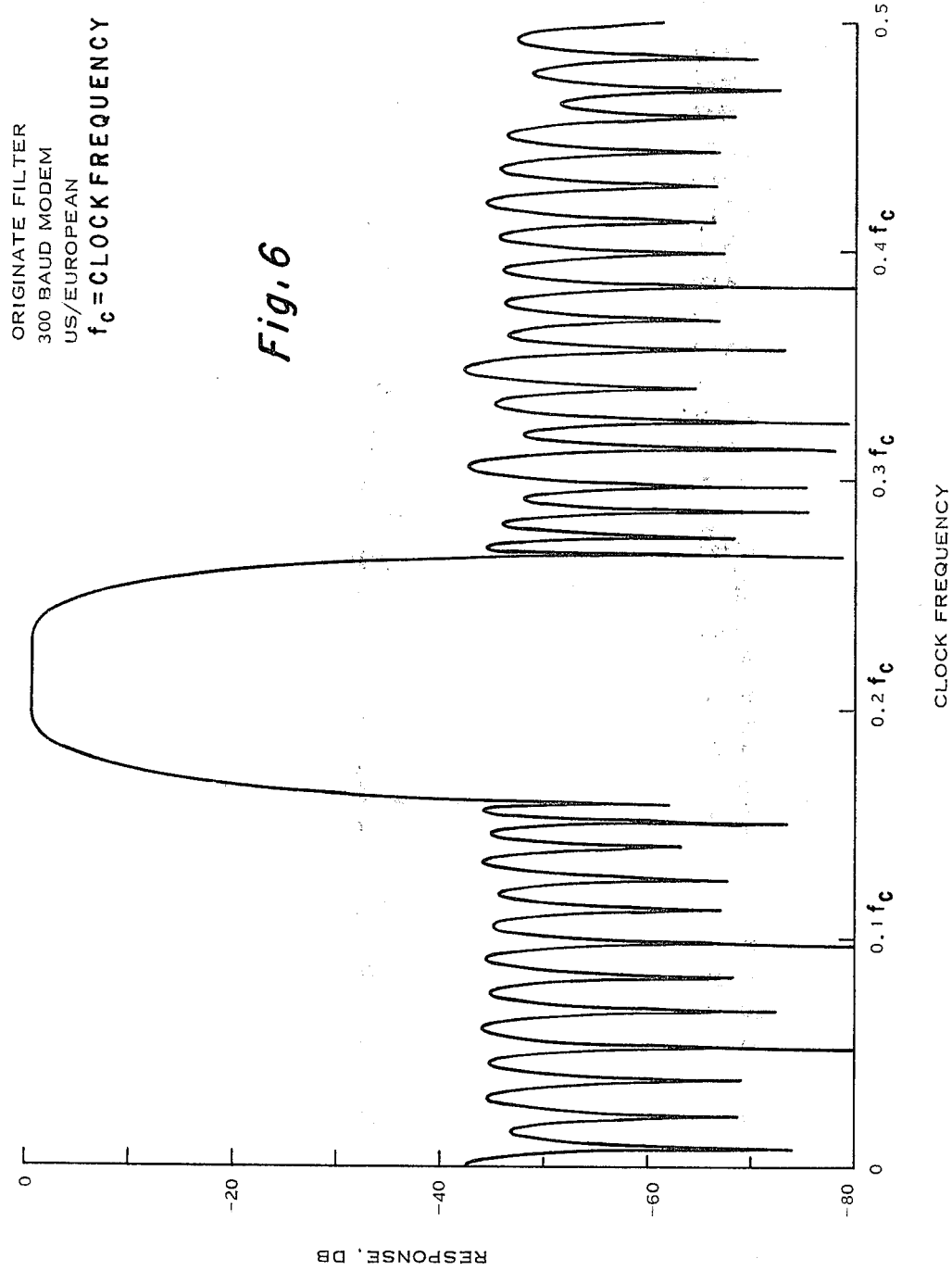
Figure 7:
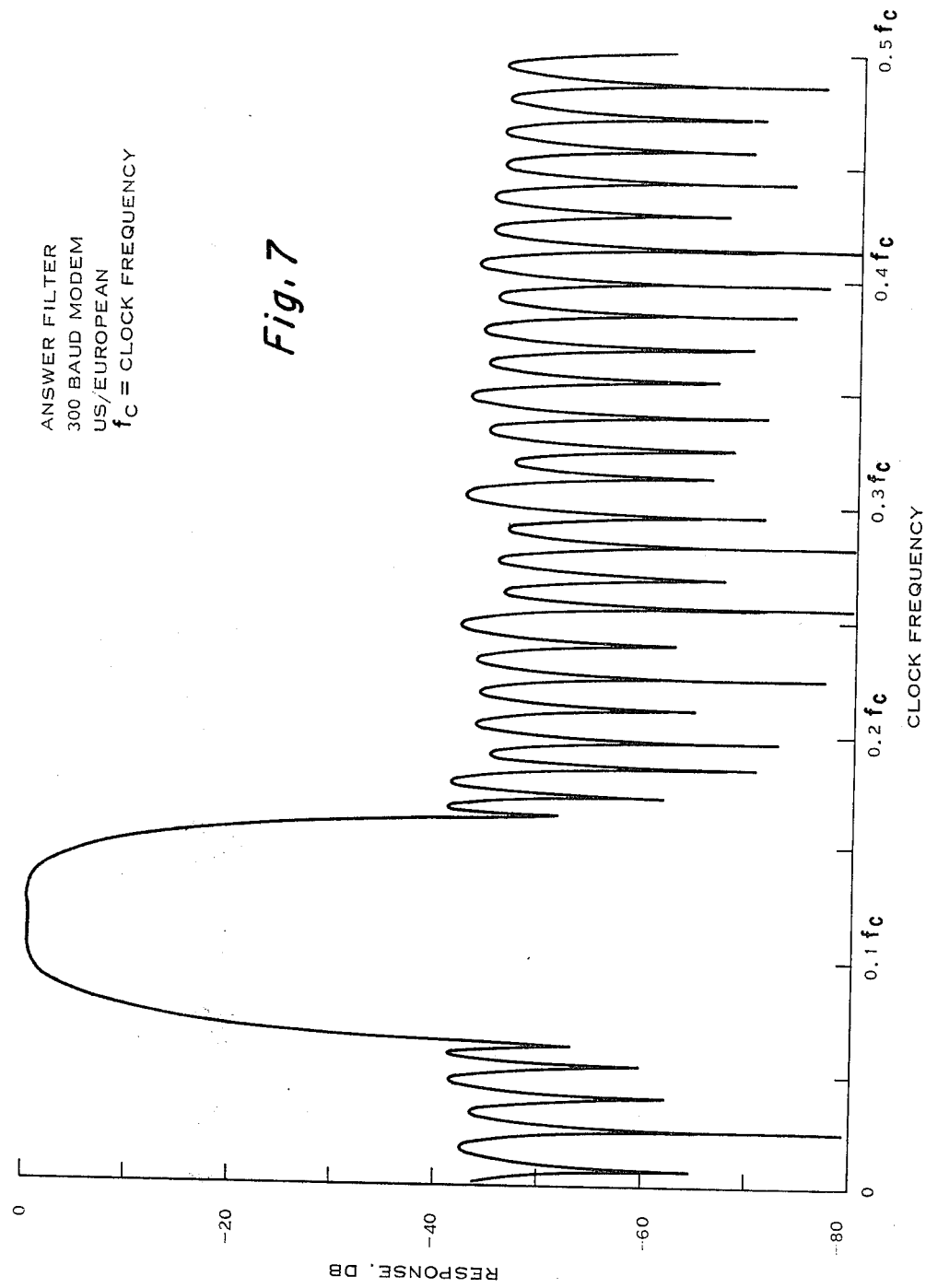
Figure 8:
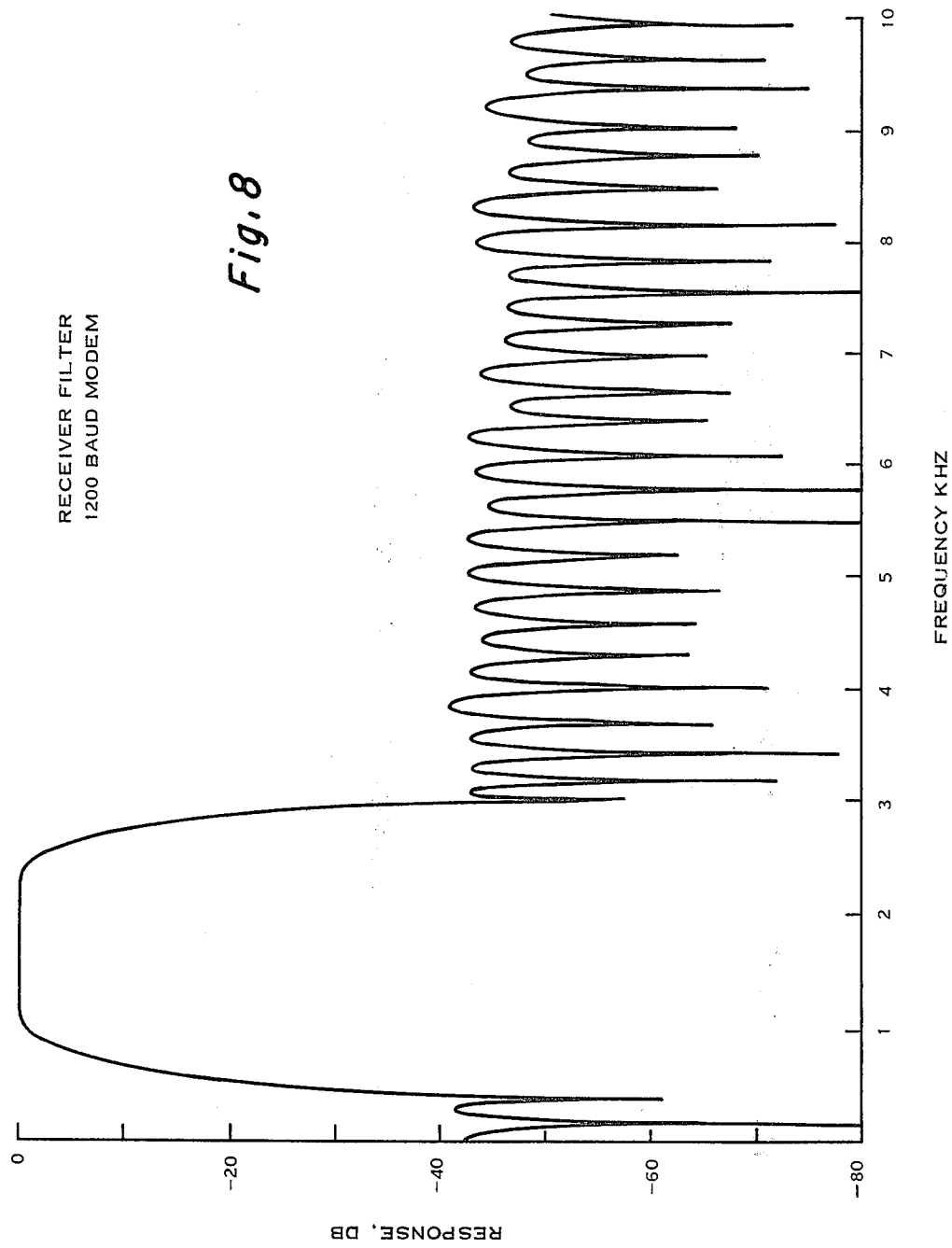
Figure 9:
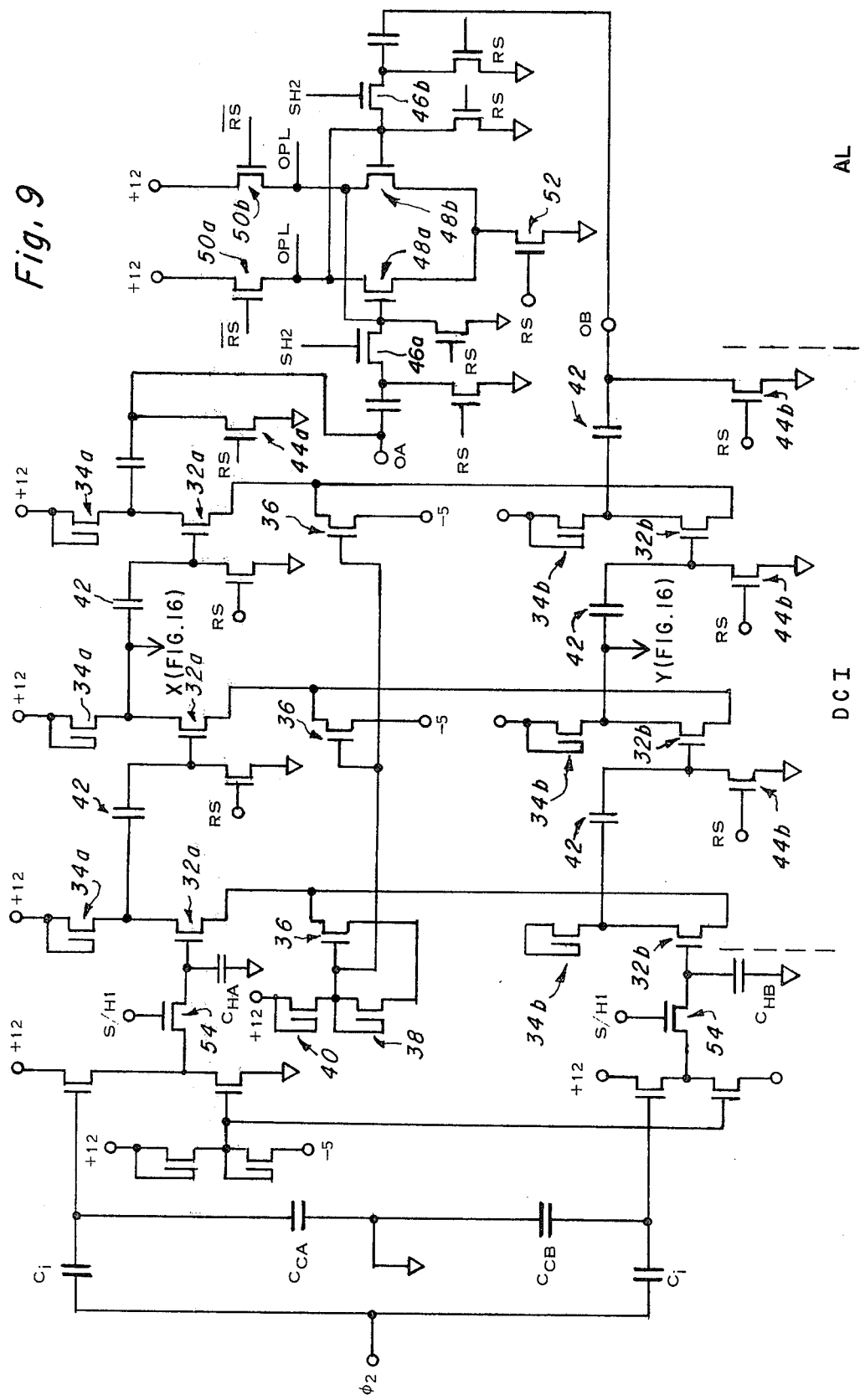
Figure 10:
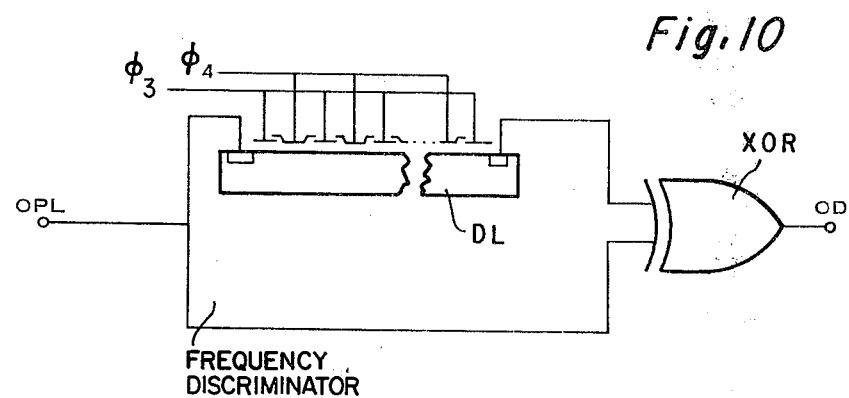
Figure 11:
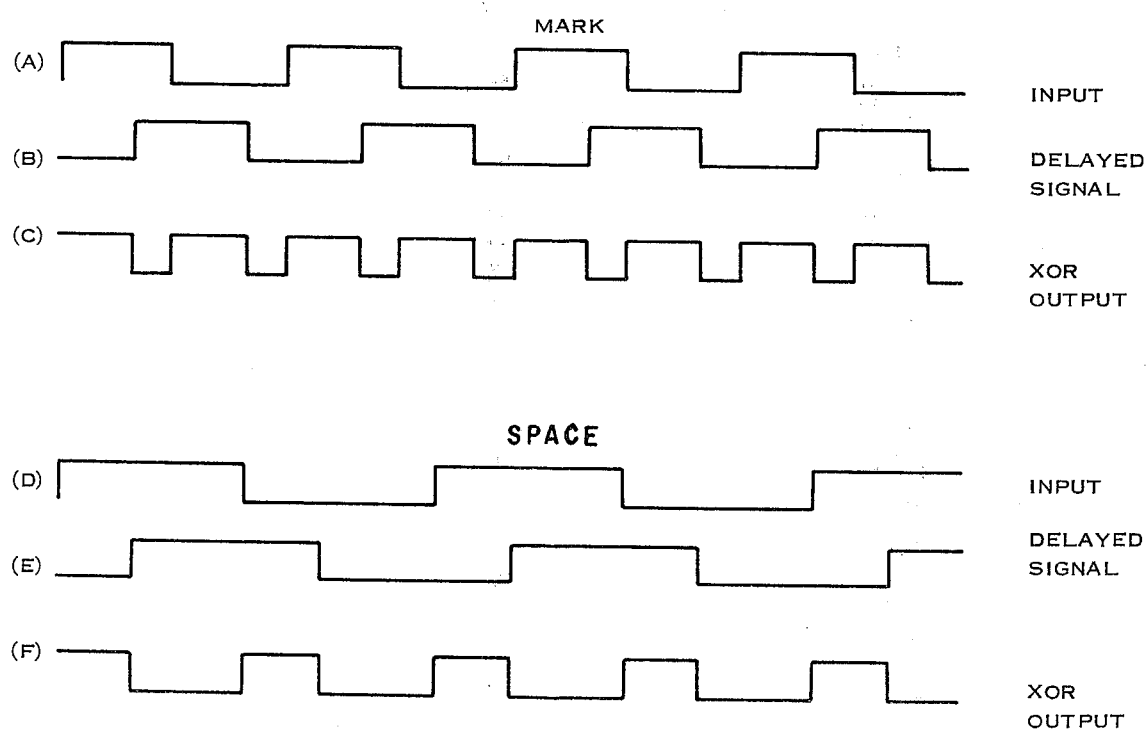
Figure 12:
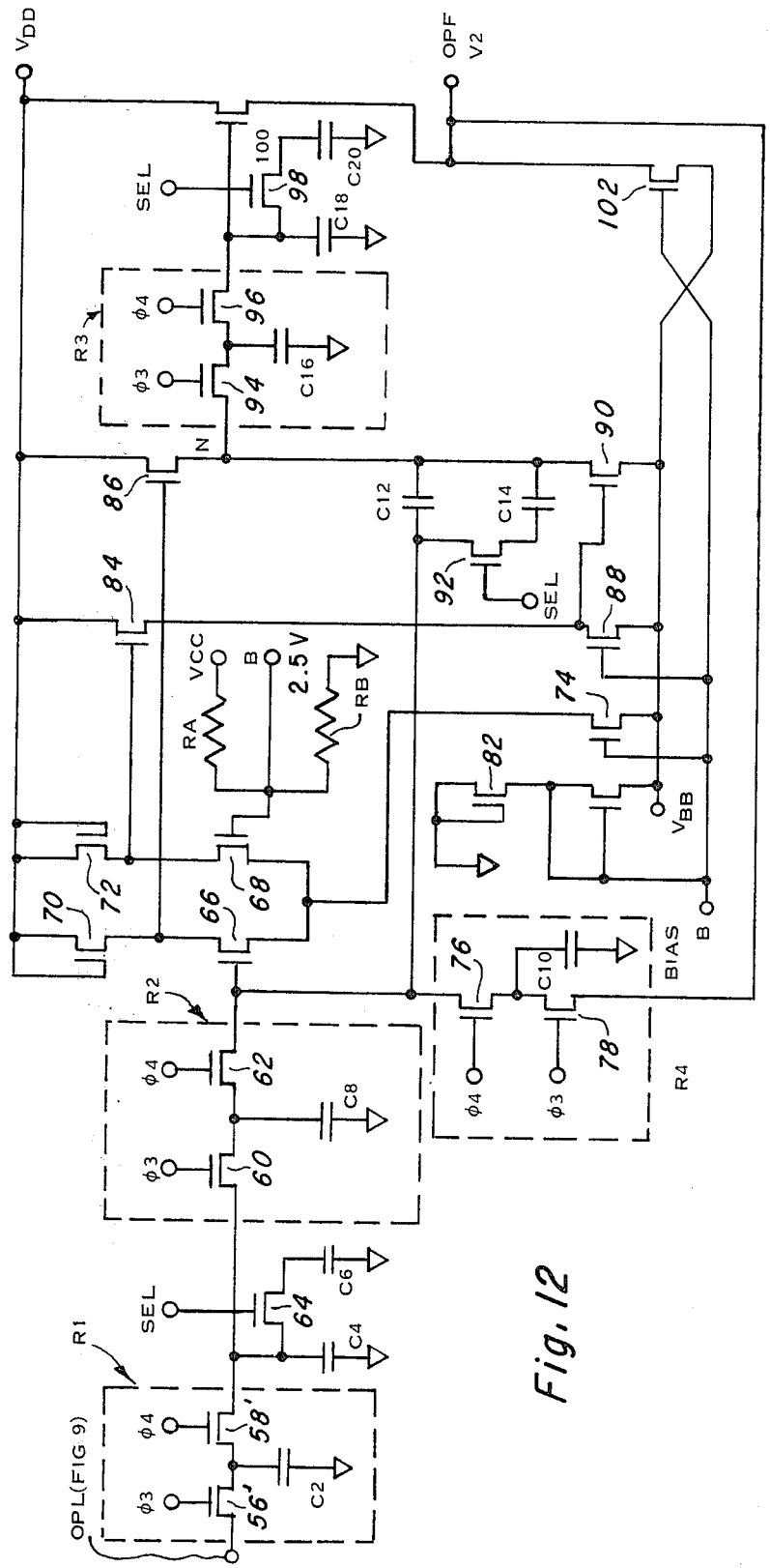
Figure 13:
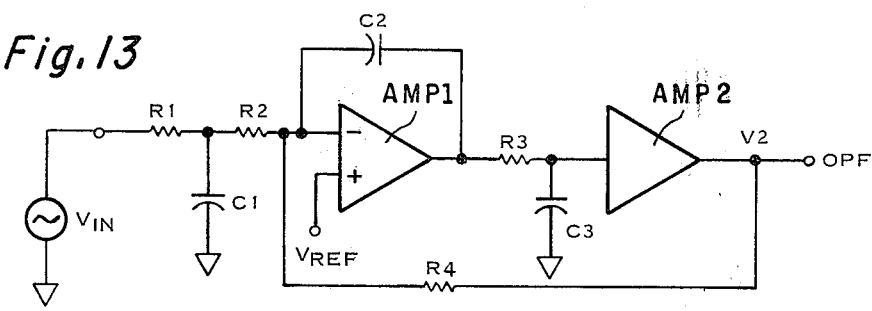
Figure 14:
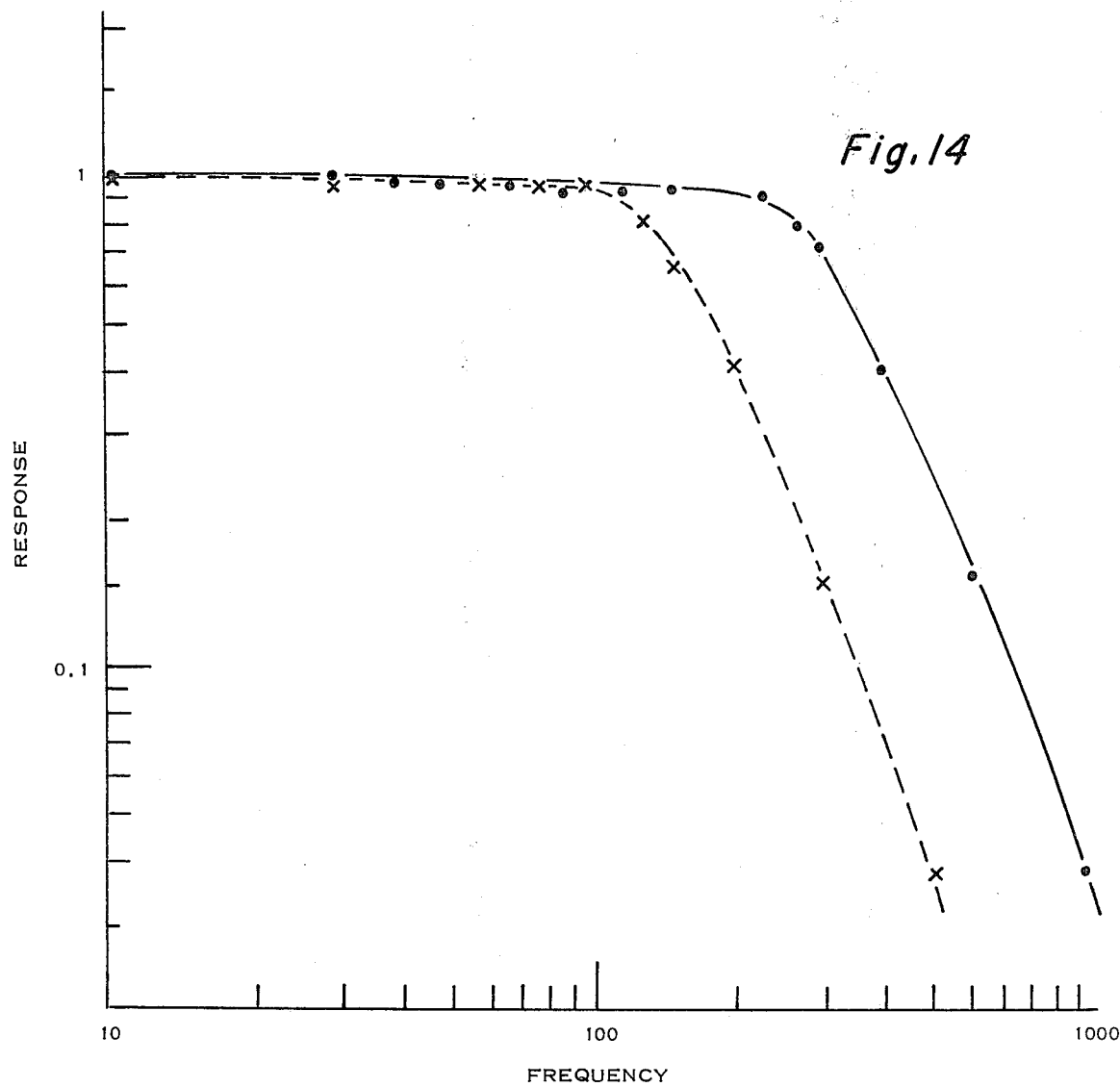
Figure 15:
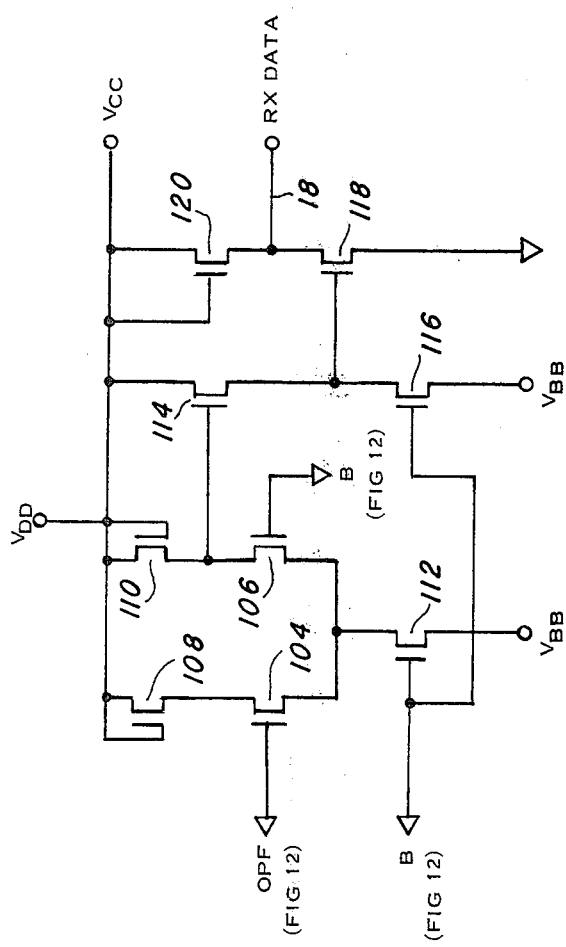
Figure 16:
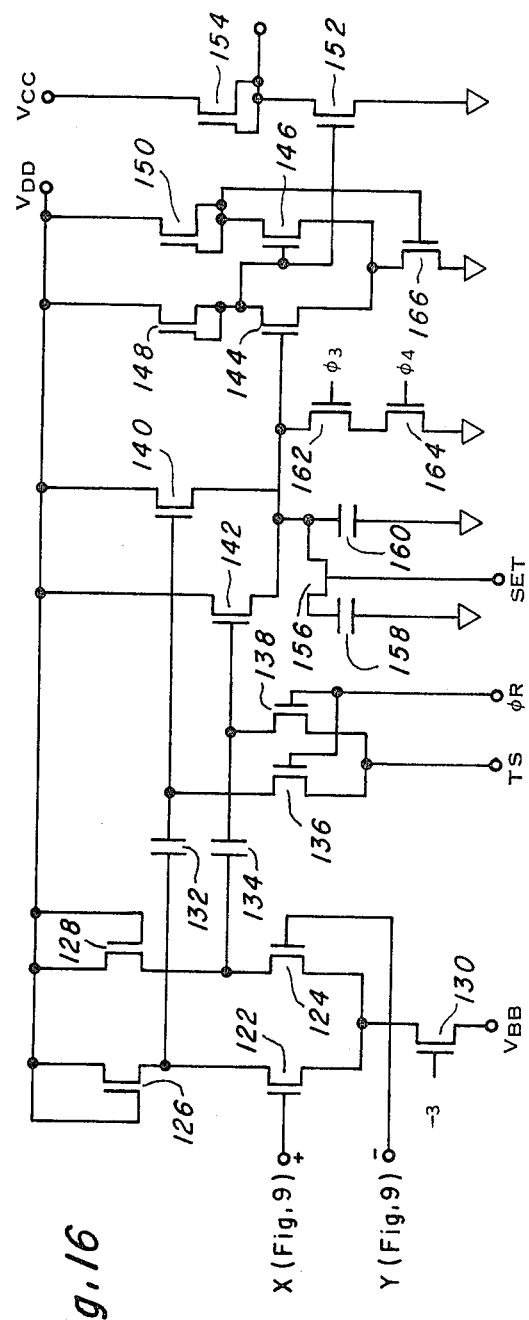
Figure 17:
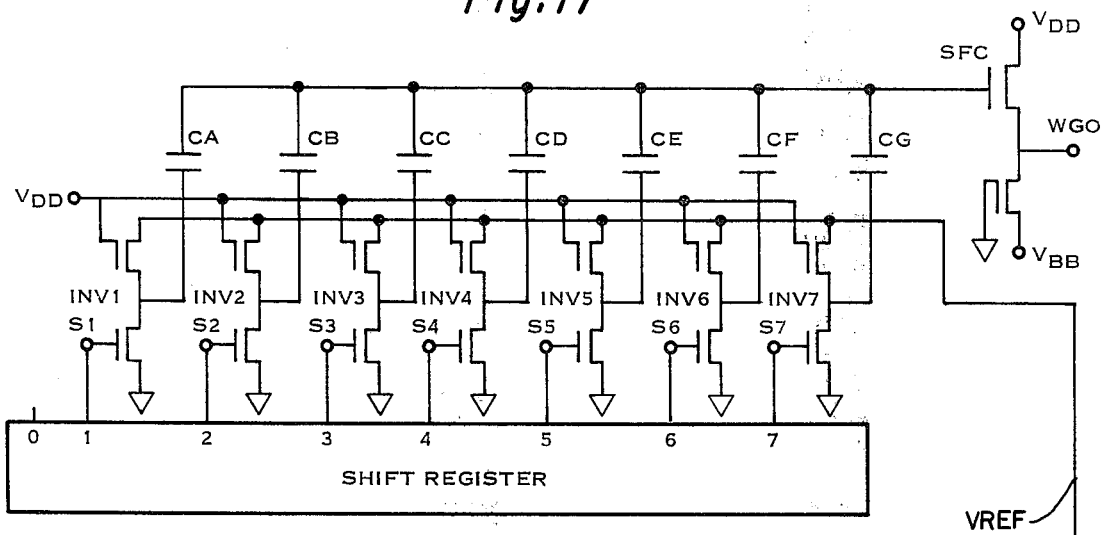
Figure 18:
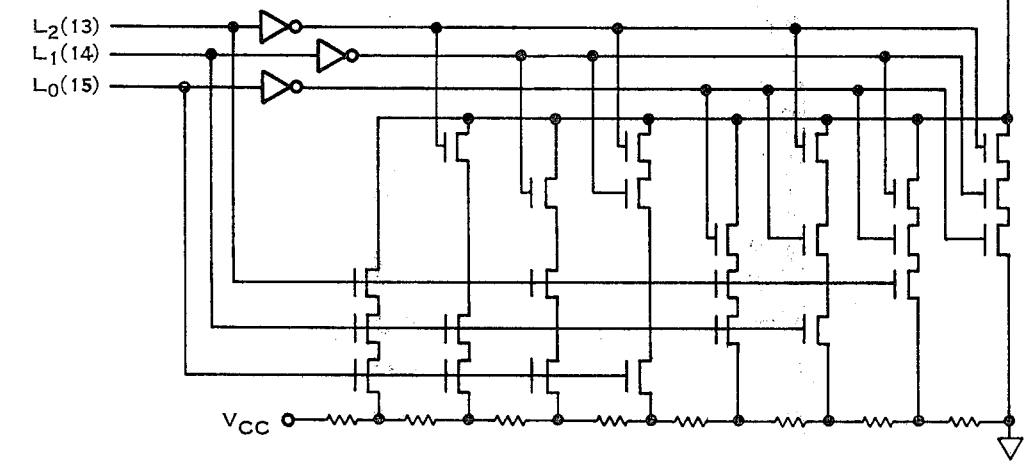
Figure 19:
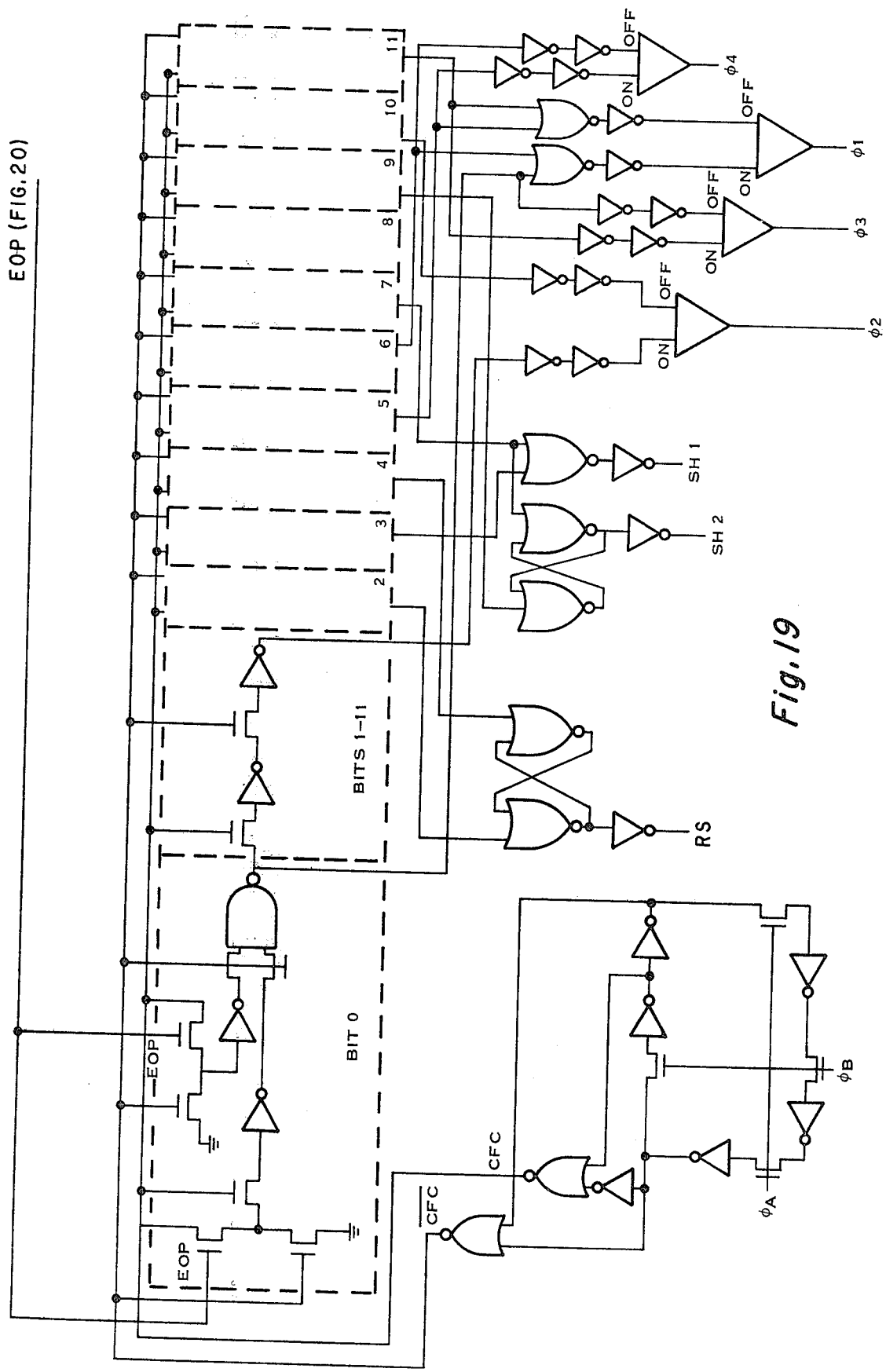
Figure 20A:
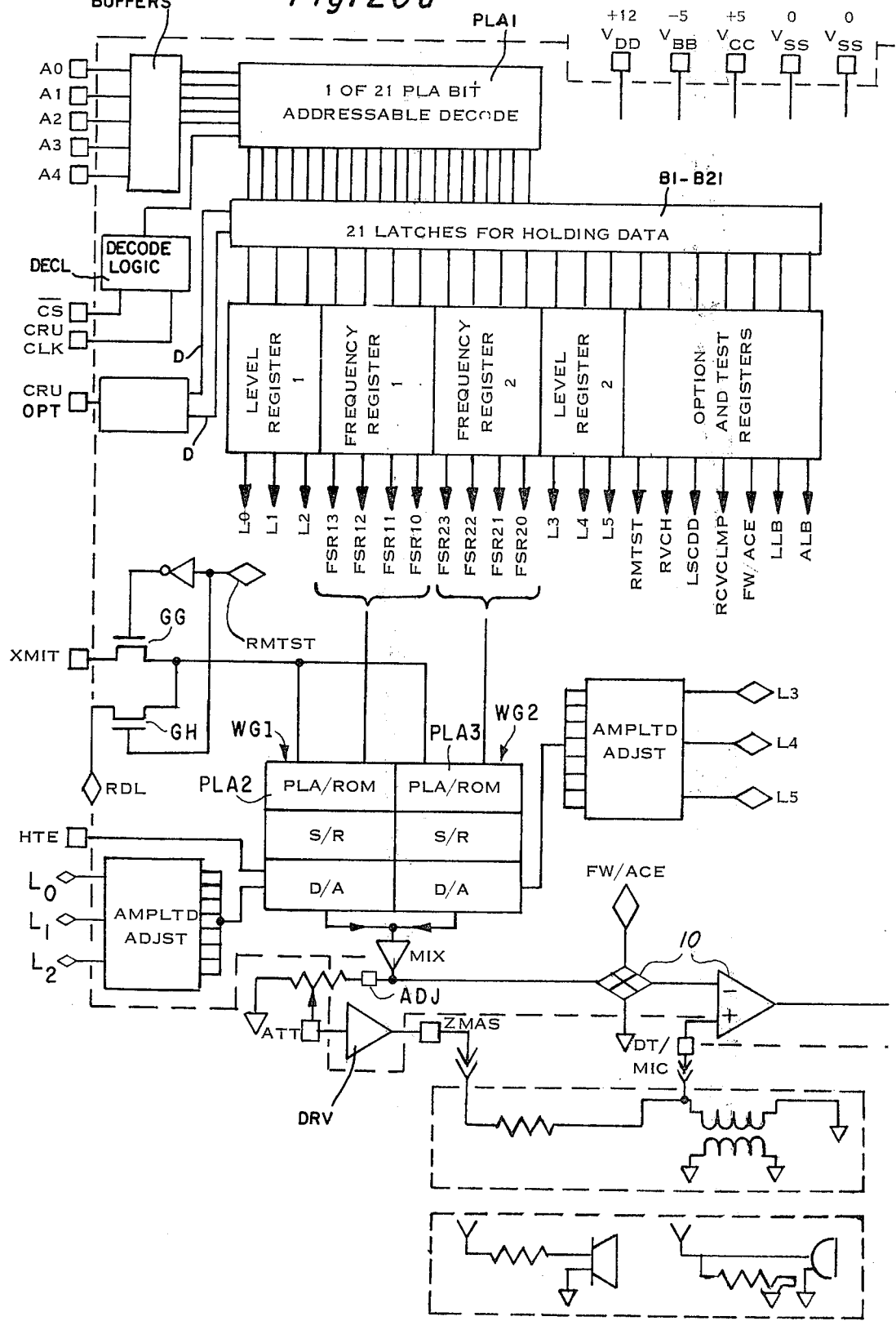
Figure 20B:
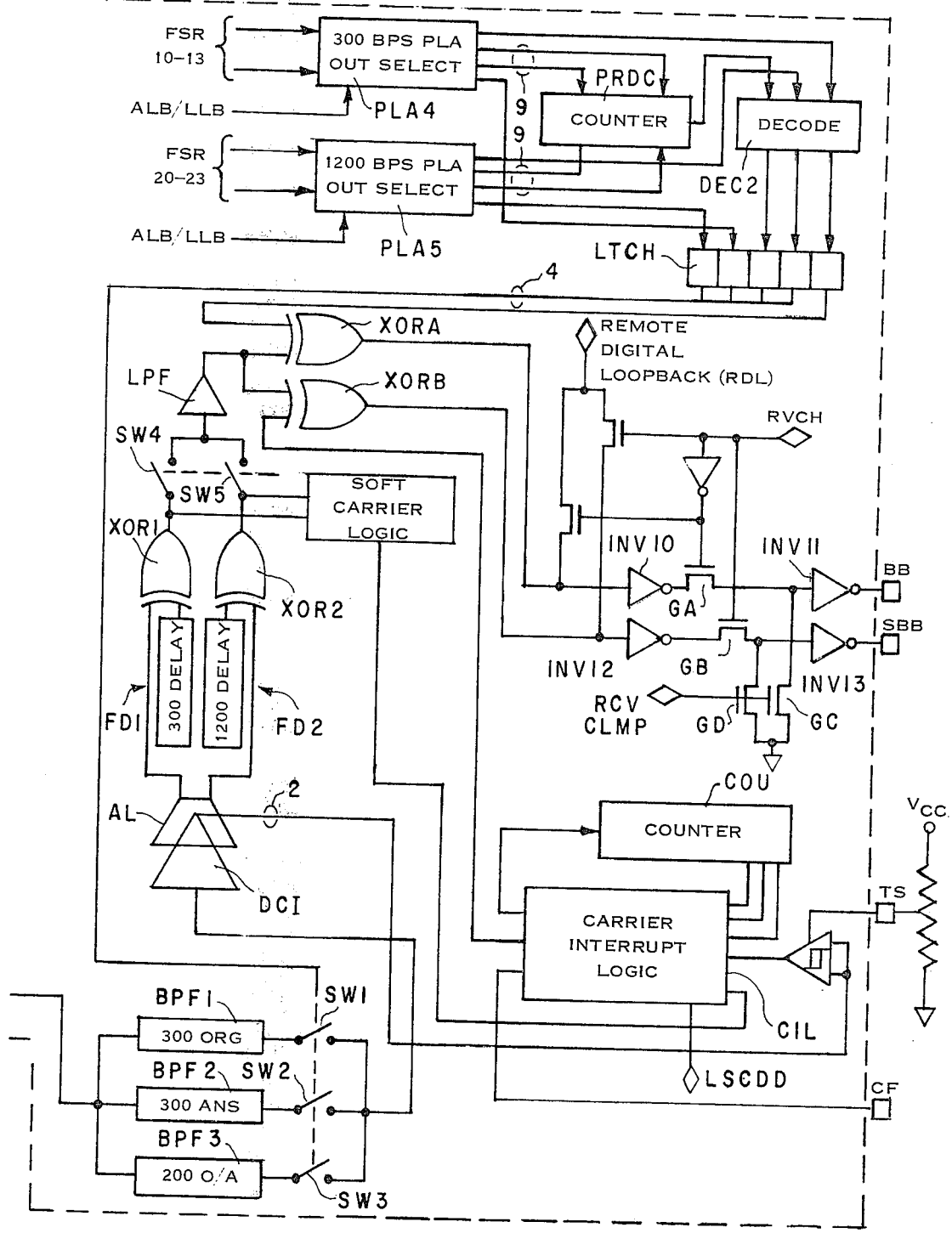

FIG. 3 diagramatically shows a charge coupled device bandpass filter structure and associated output amplifier for use in the modem of FIG. 1;

FIG. 4 shows typical waveforms suitable for use in connection with operation of FIG. 3 and circuits shown in subsequent figures;

FIGS. 5(a), 5(b) and 5(c) illustrate the structure and manner of operation of a CCD shift register suitable for employment in construction of a bandpass filter as shown in FIGS. 1 and 3;

FIGS. 6 to 8 show different bandpass filter characteristics obtainable with a single CCD bandpass filter structure such as illustrated by FIGS. 3 and 5;

FIG. 9 shows in greater detail the amplifier circuit of FIG. 3;

FIG. 10 illustrates automatically a delay discriminator indicated in FIG. 1;

FIG. 11 depicts waveforms associated with operation of the delay discriminator shown in FIG. 10;

FIG. 12 shows a circuit suitable for use as the lowpass filter shown in FIG. 1;

FIG. 13 is a simplified representation of FIG. 12;

FIG. 14 shows response characteristics representative of the operation of FIG. 12;

FIG. 15 shows the circuit of a slicer suitable for use in FIG. 1;

FIG. 16 shows the circuit of a carrier detector suitable for use in conjunction with the amplifier shown in FIG. 9;

FIG. 17 illustrates a waveform generator suitable for employment in FIG. 1;

FIG. 18 illustrates a typical waveform generated by the waveform generator of FIG. 17;

FIG. 19 illustrates a clock generator circuit for providing various pulses for operation of the modem;

FIGS. 20(a) and 20(b) illustrate the modem together with associated control circuits; and FIG. 21 shows an alternative form of discriminator suitable for employment in FIG. 1.

The modem to be described is designed for operation at 300 baud on U.S. or C.C.I.T.T. standards as well as at 1200 baud. The modem includes full duplexing on 300 baud originate and answer channels, operates at half duplex at 1200 baud and also provides various low speed supervisory functional modes.

The basic structure of modem is shown in FIG. 1. It includes a duplexer 10 having a receive/transmit terminal 12 for connection to a data communication line 14 e.g., a telephone line, to receive or send FSK analog signals from or to a modem forming part of a communications terminal at the remote end of the line 14. The coupling to line may be direct or via an acoustic coupler.

FSK analog signals received by the duplexer 10 from the line 14 are transformed into digital signals by a receive section of the modem. The received signals are amplified by a preamplifier 16 and routed through one of three CCD bandpass filters BPF1, BPF2, BPF3 dependent on which one of three selection switches SW1, SW2, SW3 of a filter selector circuit FSC is closed. The filtered output signal is passed from the selector circuit FSC for amplification by a differential current integrator DCI the output of which is amplitude limited by a limiter AL and detected by a discriminator FD1 or FD2, selected by switches SW4 and SW5 which are operated in conjunction with switches SW1–SW3 which produces an output signal having an envelope dependent on the frequency of the input signals thereto. The discriminator output is passed through a lowpass filter LPF to remove high frequency components of the discriminator output and then by slicer SL to a receive data line 18 in the form of digital mark/space signals for processing by a communications terminal of which the modem is a part.

The modem also includes a transmit section comprising two digital-analog waveform generators WG1 and WG2 actuated, respectively, by digital mark and space control signals MI and SI to generate sine wave outputs providing frequency shift keyed mark/space signals at input terminal 20 of the duplexer 10 which routes that input signal to the communication line 14 for transmission to the modem at the remote communication terminal.

Figure 2:
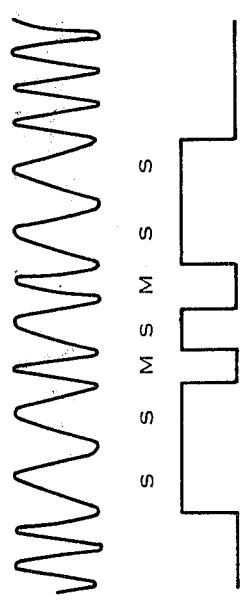
FIG. 2 shows FSK and mark/space signals associated with operation of the modem shown in FIG. 1.

FIG. 2 illustrates at A typical FSK analog signals as received at the duplexer 10 from the line 14, and at B corresponding mark/space digital signals produced on the received data line 18 from such received analog signals. Likewise waveform A illustrates typical FSK analog signals as presented at the duplexer input terminal 20 by the waveform generators WG1 and WG2 in response to the mark/space control signals MI and SI.

The filters BPF1, BPF2, BPF3 and the discriminators FD1 and FD2 all include charge coupled device structures (CCDs) and, together with the selector FSC, the filter LPF, the current integrator DCI, the limiter AL and the waveform generators WG1 and WG2 which all may be provided by IGFET circuits, are operated by asynchronous clock signals supplied from a central control unit CMU.

As will be discussed in the following description, the same structure can be used for each of the CCD bandpass filters and they can be tuned, together with the discriminator and low pass filter, merely by appropriate adjustment of the frequency of the clock signals used for operation thereof, thus reducing the number of components needed and simplifying the design and reliability of the modem, since the same filter may be used to provide a variety of functions, and in particular a bandpass filter may be used to provide a selected one of several different passbands by adjustment to the clock frequency at which it is operated.

The topology of the CCD bandpass filter is illustrated schematically in FIG. 3. A two-phase structure is used in the preferred embodiments, suitably fabricated as described in U.S. Pat. No. 4,035,906 by Al F. Tasch et al. for SILICON GATE CCD STRUCTURE AND PROCESS and assigned to Texas Instruments Incorporated, except that alternate phase electrodes are split part way along the length thereof. As shown in FIG. 3, the phase electrodes 22 are not split and are connected to a common bus 24 driven by $\phi_1$ clock pulses shown in FIG. 4. Each split electrode 26 has portions 26a and 26b connected respectively to busses 28a and 28b which in turn are connected by individual integration capacitors Ci to a clock pulse line 30 drive by clock pulses $\phi_2$ also shown in FIG. 4. The electrode structure of bandpass filter BPF1 only is illustrated in FIG. 3, the filters BPF2 and BPF3 are similar in construction and are illustrated in block form only for the sake of convenience.

The CCD structure is illustrated by FIG. 5a. Edge overlapping phase electrodes P1 and P2, are coplanar with each other and separated from an underlying silicon substrate S by a uniform thickness silicon oxide insulator I. A charge propagation channel is defined in the substrate S by isolation regions and/or thick oxide areas as known in the art. Charge inputting structure also is provided in known manner. Beneath the forward portion of each phase electrode, in the direction of charge propagation, a layer of immobile charge W is provided at the silicon oxide/silicon interface, defining an inbuilt potential well. The structure illustrated is a two-phase structure, with the structure associated with a P1 and P2 electrode defining one bit or stage.

In the absence of $\phi_1$ and $\phi_2$ clock electrodes, an asymmetric potential well (surface potential) profile is defined beneath each P1 and P2 electrode, as shown in FIG. 5b. Charge packets can thus be stored by the inbuilt potential wells (charge storage sites). On application of a $\phi_2$ pulse, $\phi_1$ remaining off, the potential wells beneath the $\phi_2$ electrodes increase in depth and charge can transfer from potential wells beneath $\phi_1$ electrodes to corresponding deeper wells beneath the $\phi_2$ electrodes, as indicated in FIG. 5c. With $\phi_1$ and $\phi_2$ clock pulses turned on, a potential well profile similar to that shown in FIG. 5b is obtained, but at increased (more positive for a p-type substrate) surface potential levels, so that charge cannot transfer between P1 and P2 charge storage sites. However, by turning $\phi_2$ off while $\phi_1$ remains on, charge can transfer from a P2 charge storage site to a P1 charge storage site in corresponding manner to that explained with reference to FIG. 5b.

Analog input signals are sampled and inputted into the CCD filter, e.g., BPF1, in conventional manner and stored at the phase electrode locations in the form of charge packets, the sizes of which are determined by the amplitudes of the respective input signal samples. The portion of a signal sample charge stored under the split electrode portions 26a, 26b during a $\phi_2$ pulse is determined by the relative areas of the split electrode portions so that the stored samples represent amplitude weighted replicas of the input signal sample magnitudes. The charges stored under the split electrode portions 26a are integrated by capacitor Ci connected to the bus line 28a while those stored beneath the split electrode portions 26b are integrated by the capacitor Ci connected to the bus line 28b. The bus lines 28a and 28b are connected to the inputs of respective IGFET source follower amplifiers SFA and SFB respectively, the outputs of which are connected by IGFET switches SW1A and SW1B to respective sample and hold circuits comprising, respectively, IGFET sampling gates SGA and SGB and storage capacitors CA1 and CB1 which are connected to the respective inputs of the amplifier DCI. Assuming that the switches SW1A and SW1B of the frequency selector circuit FSC are closed (and that the switches SW2 and SW3 are open) the outputs of the source follower amplifiers SFA and SFB are sampled by the gates SGA and SGB during SH1 pulses occurring during each $\phi_1$ pulse as shown in FIG. 4, summed by the capacitors CA1 and CB1 and applied as the respective inputs to the differential amplifier DCI.

The splits of the electrodes 26 are individually located so that the impulse response of the filter (depicted by the broken line indicating the configuration of the splits) corresponds to a predetermined bandpass characteristic, including center frequency and passband width, determined by standard design techniques for digital finite impulse response filters, see, for example J. H. McClellan, T. W. Parks and L. R. Rabiner, "A Computer Program for Designing Optimum Linear Phase Digital Filters", I.E.E.E. Transactions on Audio and Electroacoustics, Vol AU-21, No. 6, December 1973. Typical response characteristics for the 300 baud originate and answer filters BPF1 and BPF2 and for the 1200 baud filter BPF3, each filter having 70 stages, are shown in FIGS. 6, 7 and 8, respectively.

By changing the frequency of the clock pulses, the filter passband center frequency (and bandwidth) can be adjusted to a desired value without altering the physical structures of the filters themselves. Thus, identical physical structures can be used for each of the filters BPF1, BPF2 and BPF3. Design parameters for the bandpass filters, including parameters for operation of the filters BPF1 and BPF2 to U.S. and to standards recommended by the C.C.I.T.T. (sometimes herein also referred to as "European" standards) standards are shown in the following table:

TABLE A

| Filter | Center Frequency-Hz | Band-width-Hz | Clock Pulse Frequency-Hz | | Mode |
|---|---|---|---|---|---|
| BPF1 | 2125 | 364 | 10,000 | U.S. | 300 baud FSK Originate |
|  | 1750 | 300 | 8,235 | C.C.I.T.T. | Upper baud |
| BPF2 | 1170 | 326 | 10,400 | U.S. | 300 baud FSK Answer |
|  | 1080 | 300 | 9,600 | C.C.I.T.T. | Lower baud |

TABLE A-continued

| Filter | Center Frequency-Hz | Band-width-Hz | Clock Pulse Frequency-Hz | | Mode |
|---|---|---|---|---|---|
| | 485 | 134 | 4,311 | U.S. | 150 baud FSK Reverse Channel |
| | 420 | 116 | 3,733 | C.C.I.T.T. | 75 baud FSK Reverse Channel |
| | 398 | 111 | 3,546 | | 5 baud on/off Reverse Channel |
| BPF3 | 1700 | 1200 | 20,400 | U.S./ | 1200 baud FSK Originate/ Answer |
| | 461 | 330 | 5,555 | C.C.I.T.T. | Dial or Tone Filter |

The bandpass filters BPF1, BPF2 and BPF3 are operated in a novel manner in that the $\phi_1$ pulses are shorter than and occur at twice the frequency of the $\phi_2$ pulses and a pair of $\phi_1$ pulses overlap a single $\phi_2$ pulse such that alternate $\phi_1$ pulses commence while a $\phi_2$ pulse is on and the remaining $\phi_1$ pulses commence while a $\phi_2$ pulse is off. The purpose of this clocking operation is to remove the effects of dc offset at the inputs of the amplifier DCI as will be described below.

The amplifier DCI and limiter AL are shown in more detail in FIG. 9 which also shows the electrical equivalent of the split electrode structure of the bandpass filter BPF1, the capacitances CCA and CCB representing respectively the sum of the capacitances of the split electrodes 26a and 26b shown in FIG. 3. However, the gates SW1A and SW1B have been omitted in FIG. 9.

The amplifier DCI is a differential IGFET amplifier including, in the particular embodiment illustrated, three stages, DA1, DA2, DA3 comprising differential pairs having driver transistors 32A, 32B and load transistors 34A, 34B, the sources of each pair of driver transistors 32A, 32B being fed by respective transistors 36 which feed identical currents defined by transistors 38 and 40. The differential amplifier stages are coupled by capacitors 42. The gates of the driver transistors 32A, 32B are connected to respective reset gate transistors 44A, 44B the gates of which are driven by reset pulses RS occurring during periods shortly after commencement of each $\phi_2$ pulse when a $\phi_1$ pulse also is on. The outputs OA and OB from the amplifier DCI are connected by gating transistors 46A and 46B, gated by pulses SH2 to respective inputs of the limiting amplifier AL. The limiter AL is a digital flip-flop sense amplifier comprising a pair of IGFET inverters, 48A, 50A and 48B, 50B with the output of the inverter 48A, 50A directly coupled to the input of the inverter 48B, 50B. The output OPL of the limiter AL is taken from the drain of transistor 48B and a complementary output is available at the drain of transistor 48A. The sources of transistors 48A and 48B are connected to a reset transistor 52 also gated by reset pulses RS as shown in FIG. 4. Further reset transistors 53 also gated by reset pulses RS are connected between the drains of transistors 48a and 48b, the sources of transistor 46a and 46b and ground.

In order to achieve differential offset compensation, a reference level is established which corresponds to zero signal but which includes all stray couplings and other offset effects in the differential amplifier DCI. This is accomplished by clocking the CCD bandpass filter with one phase ($\phi_1$) running at twice the frequency of the split electrode phase ($\phi_2$) as shown in FIG. 4, so that two $\phi_1$ pulses are associated with each $\phi_2$ pulse, a first $\phi_1$ pulse commencing just ahead of a $\phi_2$ pulse and terminating during the $\phi_2$ pulse, the second $\phi_1$ pulse commencing during the $\phi_2$ pulse and terminating just after the $\phi_2$ pulse. This scheme of clocking takes advantage of the fact that charge can only transfer from a $\phi_1$ electrode 22 to the adjacent $\phi_2$ electrode 26 when the $\phi_1$ clock is off and the $\phi_2$ clock is on. Thus, if the $\phi_2$ clock is turned on before the $\phi_1$ clock is turned off, the signal charge will remain under the $\phi_1$ electrode. The CCD output can then be sampled once per cycle with no signal but all offsets present at charge storage sites beneath the split electrodes and once per cycle with the signal and all offsets present at such charge storage sites.

The sequence of clocking is described below. Immediately after the $\phi_2$ pulse is turned on, ($\phi_1$ already being on) the potential on the $\phi_2$ split electrodes 26 will be sampled and stored on capacitors $C_A$, $C_B$ by the first sample pulse S/H/A applied to gates 54 and the reset switches 44a, 44b will be turned on by the reset pulse RS so that capacitors 42 are charged to an offset voltage by any stray voltages present, thereby establishing the zero signal reference. When that $\phi_1$ clock is subsequently turned off, the signal charge is transferred from beneath the electrodes 22 to the adjacent $\phi_2$ electrodes 26A, 26B creating a differential signal voltage on the associated integrating capacitors Ci. The next $\phi_1$ pulse, $\phi_1$B is turned on while $\phi_2$ is still in the on condition with the result that there is no signal charge transfer in the CCD but the stray coupling between the $\phi_1$ and $\phi_2$ electrodes is returned to the same condition that existed when the reference was established during the first sample pulse S/H1A. The sample gates 54 are again opened by a second sample pulse S/H1B without application of an R/S pulse to the reset switches 44a, 44b so that the offset voltage is subtracted from the signals applied to the gates of transistors 32a, 32b with the result that the amplifier output (OA-OB) is proportional to the differential signal on the integrating capacitors Ci without any undesired offset resulting from stray couplings. The amplifier output is gated to the limiting amplifier by sample pulses S/H2 applied to transistors 46a and 46b at the time of the second sample pulses S/H1, pulses S/H2 having a longer duration than pulses S/H1. The amplifier DCI is kept differential to the limiter flip-flop circuit LA in order to avoid problems with absolute reference level drifts. After the limiter the signal will be in digital form.

The differential delay discriminators FD1 and FD2 have a structure shown in more detail in FIG. 10, associated signal waveforms being depicted in FIG. 11. The discriminator comprises an EXCLUSIVE/OR gate XOR the inputs of which are connected, respectively, directly and by a CCD delay line EL to the output OPL of the amplitude limiter AL. The discriminator functions by forming the product of the input signal (which is a square wave representing mark/space data) with its delayed replica i.e. the output from the delay line. The delay line length and the frequency at which it is clocked are such that the discriminator output has a frequency twice that of the input signal frequency and a duty cycle determined by the input signal frequency, increasing or decreasing from 50% as the input signal frequency is greater or less than the clock frequency. The CCD delay line is, in the embodiment shown, a two-phase structure suitably fabricated by a process as described in the above identified U.S. patent application Ser. No. 737,648, and with reference to FIG. 5 herein and is operated by clock pulses $\phi_3$ and $\phi_4$ shown in FIG. 4. Data samples are inputted to and outputted from the delay line by $\phi_3$ pulses.

FIG. 11 shows typical waveforms associated with operation of the discriminator shown in FIG. 10. Mark and space signals at the discriminator input (OPL) are shown as FIG. 10a and 10d, respectively; corresponding delayed signals at the output of the delay line DL at FIGS. 10b and 10e; and corresponding signals at the output OD of the gate XOR at FIGS. 10c and 10f. The dc level of the signal at the output OD is proportional to the frequency of that signal as long as:

$$2\pi |f_m - f_s| T < \pi$$

where
$f_m$ = mark signal frequency
$f_s$ = space signal frequency.
T = delay line delay period In one embodiment, the delay line of discriminator FD1, used at 300 baud, has 20 stages while that of the discriminator FD2 used at 1200 baud has 3 stages.

FIG. 12 shows an active element, IGFET low pass filter circuit suitable for implementing the filter LPF in FIG. 1; a functional equivalent representation thereof is shown in FIG. 13. Referring to FIG. 13, the filter comprises an amplifier AMP1 having a reference voltage connected to its non-inverting input and input signals applied to its inverting input over a RC network R1, R2, C1. A capacitor C2 connects the amplifier output to its inverting input to provide an integrator function. The output of amplifier AMP1 is connected by a RC network R3, C3 to the input of an amplifier AMP2 the output of which provides the filter output OPF and is also connected by a feedback resistor R4 to the inverting input of amplifier AMP1.

With $R = R3 = R4 = 2R1 = 2R3$ and
$C = C3 = 5/4 C2 = \frac{1}{4} C1$, the filter depicted by FIG. 3 has a 3-pole transfer function $$\frac{V2}{Vin} = -\frac{1}{1 + sCR} \cdot \frac{1}{1 + sCR + s^2(CR)^2}$$

where Vin is the input voltage to the filter and V2 is the output voltage from the filter.

FIG. 12 is related to FIG. 13 as follows. IGFET transistors 56, 58, 60 and 62 and capacitors C2, C4, C8, connected in the manner shown in FIG. 12, represent the input network R1, R2, C1 of FIG. 13. Transistors 56 and 60 are gated by $\phi_3$ pulses while transistors 58 and 62 are gated by $\phi_4$ pulses. The amplifier AMP1 comprises input IGFET transistors 66, 68, load transistors 70, 72 and a common source feed transistor 74. The gate of transistor 66 provides an inverting input for the amplifier AMP1 and is connected to receive input signals from transistor 62 while the gate of transistor 68 provides a non-inverting input for the amplifier AMP1 and is connected to a reference voltage defined by a potentiometer RA, RB. Capacitor C12 represents the feedback capacitor C2 in FIG. 13.

The output from the drain of transistor 66 is applied over transistor 86 to the node N where it is summed with the output from the drain of transistor 68 applied to node N by an IGFET source follower 84, 88 and in AGFET inverter 90. The network R3, C3 of FIG. 13 is defined in FIG. 12 by IGFET transistors 94, 96 (gated by $\phi_3$ and $\phi_4$ pulses, respectively) and capacitors C16, C18 while the amplifier AMP2 is defined by an IGFET source follower amplifier comprising transistors 100, 102. The output voltage V2 is defined at the output OPF from the source of transistor 100. The feed back path R4 is represented in FIG. 12 by the IGFET transistors 76, 78 (switched by $\phi_4$ and $\phi_3$ respectively) and capacitor C10.

Use of IGFET switches aid associated capacitors to function as switched resistors, to realize R1–R4 permits very high resistance values to be obtained, approximating a value $1/fc \cdot c$ where c is the capacitance value and fc the frequency at which the IGFETs are switched.

The response of the filter network shown in FIG. 12 can be changed by application of gate levels SEL (from external logic circuits not shown) to operate the IGFETs 64, 92 and 98 to connect capacitors C6, C14 and C20 in parallel with capacitors C4, C12 and C18 respectively.

When the clock pulses $\phi_3$ and $\phi_4$ used to gate transistors 56, 58, 60, 62, 76, 78, 94 and 96 have a frequency that is high compared with the frequency of input signals Vin to the filter, a good approximation to the transfer function set forth above in describing FIG. 13 can be obtained. FIG. 14 shows typical low-pass characteristics provided by the circuit shown in FIG. 12, both with the capacitors C6, C14 and C20 connected (A) and disconnected (B). The cutoff slope is about 18 db/octave.

FIG. 15 shows a suitable IGFET implementation of the slicer SL of FIG. 1. The slicer performs a comparator function and comprises a differential amplifier including input transistors 104, 106 having a common source feed transistors 112, and load transistors 108, 110 respectively. The output signal from the low-pass filter output OPF is applied as an input to the transistor 104 while the gate of transistor 106 is connected to the bias voltage point B (FIG. 12). The amplifier output is taken from the drain of transistor 110 and applied as an input to a source follower stage 114, 116 which converts the differential voltage swing of the differential amplifier to a gate voltage input to transistor 118 of an inverter stage 118, 120. The slicer output at the drain of transistor 118 is in the form of mark/space signals as shown in FIG. 2b.

FIG. 16 shows a carrier detector circuit comprising IGFET devices and having input connected to the points X and Y in FIG. 9. The detector functions to detect when the carrier level of an incoming FSK signal has dropped below a predetermined level, in response to which the detector provides an output used to clamp the Rx data line 18 in FIG. 9 to a condition preventing onward transition of signal information and indicating invalid input data.

The bandpass filtered signals appearing at points X and Y are applied as inputs to the gates of transistors 122, 124 forming the input transistors of a differential amplifier which also includes a common source feed transistor 130 and load transistors 126, 128. Outputs from the drains of transistors 122 and 124 are coupled by capacitors 132, 134 to the gates of transistors 140, 142 which, together with transistors 162, 164 and capacitor 160 (and also capacitor 158 when connected across the capacitor 160 by transistor switch 156 gated by the level SEL) provide a peak detector function. The detected output is applied to the gate of transistor 144 forming part of a comparator having input transistors 144, 146, a common source feed transistor 166 and load transistors 148, 150. The load transistors 148, 150 have their gates commoned to their sources. The comparator has a built in hysteresis switching characteristic resulting from connection of the gate of source feed transistor 166 to the drain-source node of transistors 146, 150. The drain of transistor 144 is connected to the gate of transistor 146 and to the gate of transistors 152 which forms the driver of an output inverter stage 152, 154.

The inputs X and Y are sampled inputs and between such samples, transistors 136, 138 are gated by $\phi R$ to charge capacitors 132, 134 to the level of any offset voltages that may be present. These offset voltages then eliminate any corresponding offset voltages present during the period when sampled signals are applied at X and Y during which period $\phi R$ is in an off condition.

In operation, when the sampled inputs X and Y are associated with a carrier signal level above a predetermined level, the detected signal input at the gate transistor 144 turns that transistor on so that the gate inputs to transistors 146, 152 are low and the carrier detector output is at a high level. When the sampled signal levels at points X and Y drop below the predetermined value, the detected signal at the gate of 144 falls below the threshold voltage causing that transistor to switch off and transistors 146 and 152 to switch on, so that the output voltage at the drain of transistor 152 falls to a low level. This change in level at the drain of transistor 152 is utilized (by circuitry not shown) to change the Rx data line 18 and indicate invalid input data, as mentioned above.

The wave-form generators WG1 and WG2 conveniently may comprise switched-capacitor, synthetic sine wave generators as illustrated by FIG. 17. Capacitors CA–CG have values such that CA=CG; CB=CF=1.85CA; CC=CE=2.4CA; CD=2.6CA. The capacitors, suitably constructed as MOS capacitors, or poly-oxidepoly capacitors (polycrystalline silicon, silicon oxide) have one plate connected to the gate of a source follower IGFET output stage SFC having an output terminal WGO. The other plates of the capacitors CA–CG are connected to the outputs of respective IGFET inverters INV1–INV7, connected between a positive supply potential VREF and ground. The drivers of the inverters are gated by an 8-bit shift register according to the sequence shown in the table below, a 1 representing an on condition of the driver stage of the inverter(s) concerned. The shift register is loaded sequentially with 8 "1"s and 8 "0"s as follows:

| Time | s1 | s2 | s3 | s4 | s5 | s6 | s7 |
|------|----|----|----|----|----|----|----|
| 0    | 1  | 1  | 1  | 1  | 1  | 1  | 1  |
| 1    | 0  | 1  | 1  | 1  | 1  | 1  | 1  |
| 2    | 0  | 0  | 1  | 1  | 1  | 1  | 1  |
| 3    | 0  | 0  | 0  | 1  | 1  | 1  | 1  |
| 4    | 0  | 0  | 0  | 0  | 1  | 1  | 1  |
| 5    | 0  | 0  | 0  | 0  | 0  | 1  | 1  |
| 6    | 0  | 0  | 0  | 0  | 0  | 0  | 1  |
| 7    | 0  | 0  | 0  | 0  | 0  | 0  | 0  |
| 8    | 0  | 0  | 0  | 0  | 0  | 0  | 0  |
| 9    | 1  | 0  | 0  | 0  | 0  | 0  | 0  |
| 10   | 1  | 1  | 0  | 0  | 0  | 0  | 0  |
| 11   | 1  | 1  | 1  | 0  | 0  | 0  | 0  |
| 12   | 1  | 1  | 1  | 1  | 0  | 0  | 0  |
| 13   | 1  | 1  | 1  | 1  | 1  | 0  | 0  |
| 14   | 1  | 1  | 1  | 1  | 1  | 1  | 0  |
| 15   | 1  | 1  | 1  | 1  | 1  | 1  | 1  |

The synthesized sine wave voltage generated at the output WGO is depicted in FIG. 16. The frequency of the synthesized sine wave may be varied by controlling the 8-bit shift register to adjust the frequency at which the inverter drivers are gated according to the above table so that the same wave form generator structure can be used to generate both mark and space frequencies. The relation between the capacitance values and the sequence of switching results in a generated sine wave with significantly reduced distortion content.

The potential $V_{REF}$ may be adjusted to vary the amplitude of the sine wave output from the generator. The $V_{REF}$ value is defined by the tapping point selected on gated resistor chain connected between $V_{cc}$ and ground, which is operated to provide preselected values of $V_{REF}$ dependent on the particular L0, L1, L2 inputs.

The clock generator, forming part of the central control unit CCU is shown in FIG. 19 and operated under control of two non-overlapping 1 MHz pulse trains $\phi A$ and $\phi B$ in conjunction with a 12-stage counter. The $\phi A$ and $\phi B$ pulses may be obtained from an external 2 MHz clock or from an internal oscillator—external crystal to system ground—provided as part of the Modem system. The outputs of the counter are used to operate gates and inverters to produce the clock pulses $\phi 1$, $\phi 2$, $\phi 3$, $\phi 4$, SH1, SH2, and RS with the required pulse widths and phase relations as illustrated by FIG. 4. The changes in frequencies of the various clock pulses required for operation of the Modem circuits in different modes, e.g. to change the bandpass characteristics of the filters BPF1–BPF3 the delays of the discriminator delay lines DL, are controlled by clock pulses EOP applied to the individual counter stages. The pulses EOP have a nominal 500$_{ns}$ pulse width and variable interpulse spacing determined in a manner to be described with reference to FIG. 20.

FIG. 20 illustrates the Modem structure shown in FIG. 1 together with associated control circuits, forming part of the central control unit CCU, for selecting the required filters and clock pulse frequencies for operation of the Modem in a desired mode, for controlling the wave form generators to generate the required mark/space frequencies at the required amplitudes, and for performing various supervisory and test functions, themselves well known in the art. It is to be appreciated that the Modem, when configured properly has the feasibility for totally independent operation between receiver sections and transmitter sections. Infinite attentuation applied to the waveform generators WG1 and WG2 via the level registers allow the receiver to be configured for any desired receiving mode. On the other hand, the received data terminal BB and secondary received data terminal SSB can be clamped which allows either WG1 or WG2 to generate any desired frequency.

To set up the Modem in a required mode of operation, digitally encoded control signals, for example obtained from a custom or standard microprocessor such as a TMS9900, TMS9980 TMS9940, or TMS8080, manufactured and sold by Texas Instruments Incorporated, are applied to terminals A0–A4 and inputted via TTL-MOS buffers BUF to a programmable logic array (PLA) PLA1 providing a 1 out of 21 bit addressable decode function to select an individual 1 of 21 latches B1–B21 dependent on the particular address code present. A chip select input $\overline{CS}$ is applied together with a CRU clock from the microprocessor to decode logic DECL, the output of which when valid enables the selected output line from PLA1 and the corresponding one of the latches B1–21. Each time a CRU clock pulse is applied to the terminal CRU-CLK, control data is fed from the CRU-OPT terminal from the microprocessor and loaded into the selected latch. Thus, 21 individual CRU-CLK pulses are required to enter control data into all of the latches B1–B21. The latches may be selected individually in any desired sequence and the content of the latches may be changed individually. When the latches all have been loaded, the $\overline{CS}$ input is disabled until a change is required in the control data loaded in any of the latches. The described address scheme is for a bit addressable bus but interfacing to a TMS 8080 address bus can readily be achieved with no added complexity.

The control data, available from registers connected to the outputs of the latches B1–B21, are used to perform the following functions.

LEVEL REGISTERS 1 and 2

These registers provide data outputs L0, L1, L2, L3, L4, L5 used to control the amplitudes of the sine wave outputs in 3 db increments (3, 6, 9, 12, 18 db and infinite attenuation) from the waveform generators WG1 and WG2 as previously described with reference to FIG. 18.

FREQUENCY REGISTERS 1 AND 2

Frequency select register FSR1 provides outputs FSR10–FSR13 for determining in conjunction with transmit input pulses on terminal XMIT, the frequency of the sine wave output of the waveform generator WG1. The outputs FSR10–FSR13 are applied as inputs to a PLA/ROM decoder PLA2 which generates the inputs to the shift register of the waveform generator WG1 for controlling the frequency at which the transistors S1–S7 (FIGS. 17 and 18) are switched and hence the sine wave output frequency. In like manner, the outputs FSR20–FSR23, in conjunction with an input on the terminal XMIT, provide inputs to a PLA/ROM decoder PLA3 of the waveform generator WG2 for controlling the sine wave output frequency thereof.

In TABLES B and C below, the manner in which the FSR and XMIT data inputs to the waveform generators WG1 and WG2 are used to control the frequency of the transmitted mark space signals in various modes of operation of the Modem and in accordance with U.S.A. and C.C.I.T.T. standards is set forth.

TABLE B

| | FREQUENCY REGISTER 1 | | | | | |
|---|---|---|---|---|---|---|
| FSR1-3 | 2 | 1 | 0 | XMT DATA | XMT FREQ. | XMIT AT 2MAZ |
| 0 | 0 | 0 | 0 | X | 1209 | TOUCH-TONE |
| 0 | 0 | 0 | 1 | X | 1336 | TOUCH-TONE |
| 0 | 0 | 1 | 0 | X | 1477 | TOUCH-TONE |
| 0 | 0 | 1 | 1 | X | 1633 | TOUCH-TONE |
| 0 | 1 | 0 | X | 0 | 1180 | 300 ORG/SPACE/C.C.I.T.T. |
| 0 | 1 | 0 | X | 1 | 980 | 300 ORG/MARK/C.C.I.T.T. |
| 0 | 1 | 1 | X | 0 | 1850 | 300 ANS/SPACE/C.C.I.T.T. |
| 0 | 1 | 1 | X | 1 | 1650 | 300 ANS/MARK/C.C.I.T.T. |
| 1 | 0 | 0 | X | 0 | 1070 | 300 ORG/SPACE/U.S.A. |
| 1 | 0 | 0 | X | 1 | 1270 | 300 ORG/MARK/U.S.A. |
| 1 | 0 | 1 | X | 0 | 2025 | 300 ANS/SPACE/U.S.A. |
| 1 | 0 | 1 | X | 1 | 2225 | 300 ANS/MARK/U.S.A. |
| 1 | 1 | 1 | 0 | X | | DISABLE XMITTER NO TONE FILTER |
| *1 | 1 | 1 | 1 | X | | DISABLE XMITTER TONE FILTER ENABLED |

TABLE C

| | FREQUENCY REGISTER 2 | | | | | |
|---|---|---|---|---|---|---|
| FSR2-3 | 2 | 1 | 0 | XMT DATA | XMT FREQ. | XMIT AT 2 MAS |
| 0 | 0 | 0 | 0 | X | 697 | TOUCH-TONE |
| 0 | 0 | 0 | 1 | X | 770 | TOUCH-TONE |
| 0 | 0 | 1 | 0 | X | 352 | TOUCH-TONE |
| 0 | 0 | 1 | 1 | X | 941 | TOUCH-TONE |
| 0 | 1 | 0 | X | 0 | 435 | 159 ORG/SPACE/U.S.A. |
| 0 | 1 | 0 | X | 1 | 535 | 150 ORG/MARK/U.S.A. |
| 0 | 1 | 1 | X | 0 | 450 | 75 ORG/SPACE/C.C.I.T.T. |
| 0 | 1 | 1 | X | 1 | 390 | 75 ORG/MARK/C.C.I.T.T. |
| 1 | 0 | 0 | T | 0 | 2200 | 1200 O/A/SPACE/U.S.A. |
| 1 | 0 | 0 | T | 1 | 1200 | 1200 O/A/MARK/U.S.A. |
| 1 | 0 | 1 | T | 0 | 2100 | 1200 O/A/SPACE/C.C.I.T.T |
| 1 | 0 | 1 | T | 1 | 1300 | 1200 O/A/MARK/C.C.I.T.T. |
| 1 | 1 | 0 | 0 | X | 387 | 5/SECONDARY CH./U.S.A. |
| 1 | 1 | 0 | 1 | X | 420 | 5/SECONDARY CH./C.C.I.T.T. |
| *1 | 1 | 1 | 0 | X | 900 | SOFT CARRIER TURN OFF |
| *1 | 1 | 1 | 1 | X | | DISABLE XMITTER |

*The last two states cause an internal 1004.0 H2 holding tone. The state of terminal HTE determines whether this tone is routed to the telephone line via DAA or an acoustic coupler hook-up
T - The receiver decoding determines this bit status in reverse (or supervisory) channel applications.
C.C.I.T.T. = European and rest of world standard based on C.C.I.T.T. recommendations;
ORG = Originate type Modem
ANS = Answer type Modem
ORG. A.C. = Originate acoustic coupler
O/A = Originate/Answer When the HTE terminal is grounded, the 1004.0 Hz is generated, being used in the DISABLE state for telephone line test purposes.

The waveform generator outputs are fed to a Modem output terminal ZMAS via a mixer amplifier MIX and a line driver amplifier DRV, the transmit level to the telephone line being adjustable by a potentiometer connected between the terminals ATT and ADJ.

The FSR10-13 and FSR20-23 are used also to select the required bandpass filter BPF1–BPF3 by operation of the switches SW1–SW3 and by operation of switches SW4 and SW5 of the required delay discriminator FD1 or FD2, the FSR10-13 data controlling operation of the Modem at 300 baud and the FSR20-23 data including operation at 1200 baud. The FSR10-13 and FSR20-23 data are applied as inputs to PLA/ROM decoders PLA4 and PLA5 respectively each of which as outputs connected to individual stages of a 9-stage pseudo-random down counter PRDC. The output EOP of the counter is a 500 nS pulse width series having variable interpulse spacing determined by the inputs loaded into PLA4 and PLA5. These output pulses EOP are applied to the clock generator CG as previously described with reference to FIG. 19 to control the frequencies of the clock pulse outputs thereof.

Also, the EOP pulses together with outputs from PLA4 and PLA5 are inputted to a decoder DEC2 which provides three inputs to a 5-bit latch LTCH, whose other two inputs are received from PLA4 and PLA5, these latter inputs being used to control inversion of mark and space frequencies transmitted from the low pass filter LPF in order to adapt the Modem to U.S.A. and C.C.I.T.T. standards.

Other outputs from the latch are supplied to the switches SW1–SW5 for controlling operation thereof. TABLES D and E show the various configurations of the Modem obtained in response to the FSR10-13 and FSR20-23 data. In the U.S.A. or C.C.I.T.T. 300 baud originate modes, the switches SW1 and SW4 are activated while switches SW2, SW3 and SW5 are inactivated. In the corresponding 300 baud answer modes switches SW2 and SW4 are activated while switches SW1, SW3, and SW5 are inactivated. In the 1200 baud modes, switches SW3 and SW5 are activated and switches SW1, SW2 and SW4 are inactivated.

TABLE D

| | | | | | |
|---|---|---|---|---|---|
| 300 BAUD RECEIVE DECODE | | | | | |
| FSR1-3 | 2 | 1 | 0 | ALB/LLB | TRANSMITTER CONFIGURED AS |
| 1 | 0 | 0 | X | 0 | U.S.A. ORG. DAA |
| 1 | 0 | 1 | X | 1 | U.S.A. ORG. ALB/LLB |
| 1 | 1 | 0 | X | 0 | U.S.A. ORG. ACOUSTIC |
| 0 | 1 | 1 | X | 1 | U.S.A. ORG. ACOUSTIC ALB/LLB |
| 0 | 1 | 0 | X | 0 | C.C.I.T.T. ORG. DAA |
| 0 | 1 | 0 | X | 1 | C.C.I.T.T. ORG. ALB/LLB |
| 1 | 0 | 1 | X | 0 | U.S.A. ANS. DAA |
| 1 | 0 | 0 | X | 1 | U.S.A. ANS. ALB/LLB |
| 1 | 1 | 0 | X | 1 | U.S.A. ANS. ACOUSTIC ALB/LLB |
| 0 | 1 | 1 | X | 0 | C.C.I.T.T. ANS. DAA |
| 0 | 1 | 0 | X | 1 | C.C.I.T.T. ANS. ALB/LLB |

X = DON'T CARE

TABLE E

| | | | | | | FORWARD AND REVERSE CHANNEL COMBINATIONS | | |
|---|---|---|---|---|---|---|---|---|
| FSR2-3 | 2 | 1 | 0 | ALB/ or LLB | FW (ACE) | XMIT BPS | RCV BPS | US/CCITT |
| 1 | 0 | 0 | X | 1 | 0 | 1200 | 1200 | US |
| 1 | 0 | 0 | X | 0 | 1 | 1200 | 1200 | US |
| 1 | 0 | 1 | X | 1 | 0 | 1200 | 1200 | CCITT |
| 1 | 0 | 1 | X | 0 | 1 | 1200 | 1200 | CCITT |
| 0 | 1 | 0 | X | 0 | 0 | 150 | 1200 | US |
| 0 | 1 | 1 | X | 0 | 0 | 75 | 1200 | CCITT |
| 1 | 1 | 0 | 0 | 0 | 0 | 5 | 1200 | US |
| 1 | 1 | 0 | 1 | 0 | 0 | 5 | 1200 | CCITT |
| 1 | 0 | 0 | 1 | 0 | 0 | 1200 | 150 | US |
| 0 | 1 | 0 | X | 1 | 0 | 150 | 150 | US |
| 0 | 1 | 0 | X | 0 | 1 | 150 | 150 | US |
| 1 | 0 | 1 | 1 | 0 | 0 | 1200 | 75 | CCITT |
| 0 | 1 | 1 | X | 1 | 0 | 75 | 75 | CCITT |
| 0 | 1 | 1 | X | 0 | 1 | 75 | 75 | CCITT |
| 1 | 0 | 1 | 0 | 0 | 0 | 1200 | 5 | CCITT |
| 1 | 1 | 0 | 1 | 1 | 0 | 5 | 5 | CCITT |
| 1 | 0 | 0 | 0 | 0 | 0 | 1200 | 5 | US |
| 1 | 1 | 0 | 0 | 0 | 0 | 5 | 5 | US |
| 1 | 1 | 0 | 0 | 0 | 1 | 5 | 5 | US |

X = DON'T CARE

In operation of the Modem all received and demodulated signal information is transmitted from the low pass filter LPF via an Exclusive-OR gate XORA and inverters INV10 and INV11 coupled by a gate GA to a receive data output terminal BB. In operation of the Modem in a supervisory or reverse channel mode, when the bandpass filter BPF2 is selected for operation at data rates of 0–5 bauds, a RVCH output from the option and test register associated with latches B1–B21 enables a gate GB coupling inverters INV12 and INV13, (and is also inverted to disable gate GA) to reroute the output of the low pass filter LPF to an output terminal SBB.

A soft carrier logic circuit SCL receives outputs from the exclusive OR gates XOR1 and XOR2 and is operable in the 1200 band half duplex mode to detect the presence of any out of band signal typically in the 900–950 Hz range. Sensing the soft carrier signal (transmitted to the note that signal transmission has been terminated) activates the carrier interrupt logic CIL and initiates operation of the associated up counter COU. Detection of the soft carrier turn-off signal for approximately 8 mS or 4 mS, depending on whether the LSCCD latch is set to a logic 1 or 0, causes the carrier detect line CF to go to a logic state indicating loss of signal in the bandpass range.

Other outputs from the option and test registers perform the following functions, themselves well known in the Modem art.

RMTST—This output disables a gate GE connecting the XMIT terminal to the waveform generators WG1 and WG2 and enables a gate GF coupling the output of the exclusive OR gate XORA or XORB (dependent on the position of the RVCH input) to the gate GH to provide a remote digital loop backing test condition.

LSCCD—Data on this output provides a long/short carrier detect delay function input to the carrier interrupt logic CIL. On a dial-up (DDD) line, any incoming carrier signal is delayed from appearance at the carrier detect terminal CF (pull-in) until a minimum of 16 mS delay at 300 or 1200 baud has occurred, and spurious noise or loss of carrier (drop-out) is delayed for a minimum of 8 mS at 300 or 1200 baud. For a leased or private line connection, prevalent in four-wire 1200 baud full duplex operation, the above delay times are halved, namely to 8 mS (pull-in) and 4 mS (drop-out).

RCVCLM—Data on this output enables gates GC, GD, clamping the inputs to the inverters INV11 and INV13 to ground so that no received data can appear at the terminals BB and SBB. A receive data clamp is necessary in both 300 and 1200 baud half duplex Modem operation.

FW/ACE—Output data on this terminal is applied to the multiple switching network MSN to provide the correct internal terminations for two-wire direct line coupling via a DAA or line protection devices, or four-wire (leased line or acoustic coupler A/C) operation of the Modem.

LLB, ALB—These outputs are applied to PLA4 and PLA5 as shown in Tables D and E. The LLB output provides a local loop back test condition in which the local Modem transmitter and receiver are set up to transmit and receive the same frequencies which are transmitted around the resultant loop for system test or local copy procedures. The ALB output provides an analog loop back test condition similar to the LLB test function except that the signal is circulated wholly within the local Modem transmit/receive loop (the generated signal is not transmitted to the telephone line), thereby testing all functions except the line driver circuit. This latter capability is especially critical in leased line multidrop network testing.

The system described and illustrated with respect to the preceding figures can be constructed as a single integrated circuit on a common semiconductor substrate, such integrated circuit being indicated by the dashed line outlined IC in FIG. 20, the various square boxes representing output terminals from the semiconductor package. The CCD structures and IGFET transistors may all be fabricated using N-channel, MOS technology, using a double level polycrystalline silicon gate electrode and interconnection structure with silicon oxide insulation between the interconnection levels. The various capacitors conveniently may be defined by overlying polycrystalline silicon and intervening silicon oxide regions.

From the foregoing it will be seen that with only two CCD bandpass filters, the Modem can operate at 300 baud on a full duplexed basis for either USA or CCITT standards. One filter is used for the originate channel and the other for the answer channel, with the required change in filter bandpass characteristics required to meet USA and CCITT standards being effected merely by changing the clock frequencies applied to the filters. A third CCD bandpass filter is provided for selective operation either in an originate or answer mode for half duplex 1200 baud operation, this filter again being tunable with respect to its bandpass characteristic by the clock frequency applied thereto. By adjusting to bandpass for the bandpass filter BPF3, a bandwidth suitable for detecting numerous line status tones, such as dial tones or busy tones, is achievable and can be utilized in automatically dialling a desired number either by push button or pulse dialling methods. The 300 baud answer channel bandpass filter also is utilized, again by appropriate adjustment of the clock frequency applied thereto, to provide for reverse channel operation at 150,75, or 5 baud for various supervisory and test functions, all associated with 1200 baud operation.

Utilization of charge coupled device bandpass filters and delay lines, thus not only provides for construction of a sophisticated Modem, but also of a Modem structure in which the filters have a relatively simple structure, and due to each structure being capable of providing several different filter characteristics, may be constructed in an economical manner. Furthermore, construction of a Modem in which the transmission channels, analog operational amplifier and comparators and all the required support clock driver and control circuits may be provided as a single integrated circuit structure using a combination of charge coupled devices and IGFET transistor structures fabricated using current state of the art semiconductor technology, is possible.

To those versed in the art, it will be apparent that adaptation of the FSK demodulator described herein to provide for phase or phase/amplitude demodulation may be carried out.

An alternative form of waveform generator may be utilized which comprises a multi-stage CCD transversal filter, conveniently using split electrode weighting coefficient techniques. For example, a 16-stage filter having an impulse response which is one cycle of a sine wave may be used, the weighting coefficients being defined according to:

$$h_k = \sin \frac{2\pi k}{16} \quad 1 \leq k \leq 16$$

If the CCD is clocked at a frequency $f_c$ and a single pulse is inputted to the filter every sixteenth clock pulse period, a continuous, sampled since wave f(t) is generated:

$$f(t) = \sin \frac{2\pi\ T_c\ n}{16} \quad \begin{array}{l} \text{where } T_c = 1/f_c \\ \text{and } t = nT_c \end{array}$$

This concept can be extended to generation of an arbitrary waveform and in particular to generate a signal:

$$x(t) = \sin \frac{(2\pi\ T_c\ n)}{16} + \tfrac{1}{2} \sin \frac{(2\pi \cdot 3 \cdot T_c n)}{16}$$

which is a sine wave having a frequency of $f_c/16$ together with its third harmonic at an amplitude of half that of the fundamental component. This waveform, passed through a non-linear device (such as an acoustic coupler), can be used to eliminate second harmonic content in the resultant signal.

An alternative form of discriminator FD is illustrated by FIG. 21. Received signals from the limiter AL are applied as inputs to four CCD transversal filters, conveniently employing split electrode weighting coefficient techniques. Two of the filters SFI and SFQ have weighting coefficients matched to a square wave at the "space" frequency, with the response of filter SFQ having a quadrature relation to that of the filter SFI. The outputs from the filters are amplified by charge coupled differential amplifiers SAI and SAQ, for example, as disclosed in U.S. patent application Ser. No. 672,939, filed Apr. 2, 1976, by C. R. Hewes and assigned to the assignee of the present application and inputted to a summer SS. The amplifier SAI and SAQ produce outputs characteristic of the magnitudes of the inputs thereto. The filters SFI and SFQ convolve to input signals thereto generating triangular waveforms which following magnituding and summation generate a constant d.c. level at the output of the summer SS as long as the discriminator input is a "space" frequency square wave, and a much smaller d.c. level when the input is a "mark" frequency square wave.

The other two CCD filters MFI and MFQ having in-phase and quadrature weighting coefficients matched to a square wave at the "mark" frequency, their outputs being modified and magnituded by charge coupled differential amplifiers MAI and MAQ and inputted into a summer MS. The output from the summer MS is a constant d.c. level as long as the input to the discriminator is a "mark" frequency square wave and a much smaller d.c. level for a "space" frequency square wave input.

A comparator FDC differences the output from the summers SS and MS and produces a digital output according to whichever summer output is greater in magnitude.

Although the above-described embodiments of the invention have been in the context of a MODEM structure and system, it is to be appreciated that bandpass filters tunable by the frequency of clock pulses applied thereto to adjust the passband characteristics thereof also find application in so-called CODEC systems for converting voice to digital signals, and vice versa. Such CODEC systems are discussed in IEEE Spectrum, February, 1977, pages 42 to 46 "The Military Goes Digital" by Edward F. Gallagher.

What is claimed is:

1. Apparatus for receiving and filtering modulated analog signals having different carrier frequencies including input terminal means for receiving said modulated analog signals on at least two frequency channels, a signal transmission path, an individual charge coupled device bandpass filter means for each of said two channels, switching means operable to select and connect one of said bandpass filter means between said input terminal means and said signal transmission path; each said bandpass filter means including phase electrode sets, each said set including a split electrode for signal amplitude weighting, the split electrodes of each filter means disposed and configured to define a bandpass characteristic for said filter means, means for applying phased pulses to said bandpass filter phase electrodes such that the frequencies of said phased pulses are different for each said filter and each filter has a predetermined center frequency, and means for applying switching pulses to operate said switch means to select a particular bandpass filter having a center frequency matched with the carrier frequency of the analog signal received at said input terminal means.

2. Apparatus according to claim 1, wherein said signal transmission path includes means for converting said filtered modulated analog signals to corresponding digital signals; and means for coupling outputs from said bandpass filters to said converting means.

3. Signal processing apparatus for converting modulated analog signals into digital signals, including a plurality of charge coupled device bandpass filters having identical structures and including split electrode structure for providing differential amplitude weighted analog signal filter outputs, means for selectively connecting said differential filter outputs to the inputs of differential charge amplifier means common to all said bandpass filters, and demodulator means for converting filtered analog signals to digital mark/space signals, said demodulator means including a charge coupled delay line means having an input connected to the output of said amplifier means, clock signal generator means, and additional means for selectively connecting a desired one of said bandpass filters to said charge amplifier means and for applying clock pulses to said selected bandpass filter and to said delay line means, such that said bandpass filter clock pulses have frequencies individual to the selected filter for determining the center frequency and bandwidth of said selected filter according to the carrier frequency of said modulated analog signals to be converted, and such that said clock pulses applied to said delay line produce an out-of-phase relation between signals at the input and output thereof.

4. MODEM apparatus including demodulator means for converting modulated analog signals received at a signal terminal means to digital mark/space signals, and modulator means for generating modulated analog signals under control of digital mark/space signals and transmitting said analog signals to said signal terminal means for transmission therefrom, said demodulator having input circuit means including an individual charge coupled device bandpass filter for each of at least two data channels each selectively operable according to different transmission standards, switching means operable to select and connect one of said bandpass filters between said signal terminal means and a received data signal transmission path, each of said bandpass filter means having identical structure and including multi-phase electrode sets, each said set including a split electrode for signal amplitude weighting, the split electrodes of each filter disposed and configured to define a bandpass characteristic for said filter, means for applying phased pulses to said bandpass filter phase electrodes such that the frequencies of said phased pulses are different for each said filter and each filter has a predetermined center frequency determined by the frequency of said phased pulses, and means for applying switching pulses to operate said switching means to select a particular bandpass filter and apply phased pulses thereto to provide a center frequency matched with the carrier frequency of an analog signal received on a particular channel at said signal terminal means, and said modulator means comprising a plurality of impedance means each connected between a common output means and a respective impedance switching means to control current flow through said impedance means, and means for operating said impedance switch means in a selected sequence and at an adjustable rate under control of said mark/space signals to generate at said output means an output signal having a wave form determined by said selected sequence and a frequency determined by said adjustable rate.

5. MODEM apparatus according to claim 4, wherein said impedance means comprise capacitor means.

6. MODEM apparatus according to claim 4, for receiving and generating analog FSK signals, and wherein said demodulator means includes a plurality of frequency discriminator means selectively coupled to receive filtered analog signals from said bandpass filters, each discriminator including charge coupled device delay means; said switching means also operable to apply phased clock pulses to said delay means at a frequency to provide a desired transmission delay.

7. MODEM apparatus according to claim 4, wherein said switch operating means is operable to switch said impedance switching means at a first rate in response to a mark control signal and at a different rate in response to a space control signal.

8. MODEM apparatus according to claim 7, wherein said impedance switching means comprises IGFET inverters, said impedances comprising capacitors connected between output nodes of said inverters and input nodes of an IGFET output amplifier.

9. Apparatus according to claim 8, said switch operating means operable for switching said impedance switching means in a sequence for producing a sine wave output.

10. Apparatus according to claim 9, wherein said capacitors comprise capacitors CA-CG and respective IGFET inverters INV1-INV7, wherein said capacitors have capacitance values such that CA=CG; CB=CF=1.85CA, CC=CE=2.4CA; and CD=2.6CA and wherein said inverters are switched sequentially in one sense between on and off conditions in a sequence INV1-INV7 and then sequentially switched in an opposite sense between on and off conditions in the same sequence.

11. MODEM apparatus according to claim 4, wherein in each said bandpass filter, said split electrode portions have first portions connected together and second portions connected together to provide differential amplitude weighted signal filter outputs, and differential charge amplifier means connecting said filter outputs to inputs of a differential signal limiter.

12. MODEM apparatus according to claim 11, wherein said differential amplifier means includes a pair of multi-stage IGFET amplifier channels.

13. MODEM apparatus according to claim 11, wherein said differential signal limiter means is a differential IGFET limiter.

14. MODEM apparatus according to claim 11, including frequency discriminator means for receiving signals from said signal limiter, said frequency discriminator means having an input connected by a charge coupled device delay line to a first input of an EXCLUSIVE OR gate and directly to a second input of said gate, and wherein said means for applying phased pulses to said bandpass filter clock electrodes also supplies clock pulses to said charge coupled delay means at an adjustable frequency for providing an out-of-phase relation between input and output signals of said delay line in accordance with the carrier frequency of analog signals received at said terminal means.

15. MODEM apparatus according to claim 6, wherein said frequency discriminator output is connected to low-pass filter means.

16. MODEM apparatus according to claim 15, wherein said low-pass filter means comprises an IGFET filter.

17. MODEM apparatus according to claim 16, wherein said low-pass filter means includes switchable IGFETS defining high value switched resistor functions.

18. MODEM apparatus according to claim 15, wherein said low-pass filter means has an output connected to signal amplitude slicer means.

19. MODEM apparatus according to claim 18, wherein said slicer means comprises an IGFET circuit.

20. MODEM apparatus according to claim 4, wherein said demodulator means and said modulator means are defined by circuit elements integrated on a single semiconductor body.

21. Data transmission and reception system comprising demodulator means for converting modulated analog signals received at a signal terminal means to digital mark/space receive signals, and modulator means for generating modulated analog signals corresponding to digital mark/space transmit signals;

said demodulator having input circuit means including at least one charge coupled device bandpass filter structure including multi-phase electrode sets, each set including a split electrode, the split electrodes being so disposed and configured as to define a bandpass characteristic for said filter, means for applying phased clock pulses to said electrode sets; and means for receiving filtered signals from said bandpass filter and converting said filtered signals into corresponding digital mark/space signals;

said modulator means including means for generating digital control signals and digital to analog converter means for utilizing said digital control signals to control generation of corresponding analog signal outputs; and control means operable:
(a) to control the frequency of the phased clock pulses to said bandpass filter electrode sets thereby to adjust the center frequency and bandwidth of said filter to a desired value; and
(b) to apply said digital control signals to said digital-to-analog converter means in a sequence and at a frequency to control the wave form and frequency of said analog signal outputs in accordance with said digital mark/space transmit signals.

22. A system according to claim 21, wherein said control means further applies amplitude adjust signals to said digital-to-analog converter means to adjust the amplitude of said analog output signals.

* * * * *